United States Patent
Hong et al.

(10) Patent No.: US 10,852,863 B2
(45) Date of Patent: Dec. 1, 2020

(54) ORGANIC LIGHT EMITTING DISPLAY DEVICE

(71) Applicant: Samsung Display Co., Ltd., Yongin-si (KR)

(72) Inventors: Jung-Moo Hong, Songpa-gu (KR); Kyungseop Kim, Hwaseong-si (KR); Sungkyun Park, Hwaseong-si (KR); Jinbo Shim, Yongin-si (KR); Sang Youn Han, Gangnam-gu (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/385,987

(22) Filed: Apr. 16, 2019

(65) Prior Publication Data

US 2019/0324567 A1   Oct. 24, 2019

(30) Foreign Application Priority Data

Apr. 18, 2018  (KR) .......................... 10-2018-0044959

(51) Int. Cl.
| | |
|---|---|
| *G06F 3/041* | (2006.01) |
| *H01L 27/32* | (2006.01) |
| *H01L 51/00* | (2006.01) |
| *H01L 51/52* | (2006.01) |
| *H01L 51/56* | (2006.01) |

(52) U.S. Cl.
CPC ............ *G06F 3/041* (2013.01); *H01L 27/323* (2013.01); *H01L 27/3255* (2013.01); *H01L 51/0097* (2013.01); *H01L 51/5281* (2013.01); *H01L 51/56* (2013.01); *H01L 2227/323* (2013.01); *H01L 2251/5338* (2013.01)

(58) Field of Classification Search
CPC ....... G06F 3/041; G06F 3/044; H01L 27/323; H01L 27/3255; H01L 51/5281; H01L 51/56; H01L 51/0097
See application file for complete search history.

(56) References Cited

U.S. PATENT DOCUMENTS

| | | | |
|---|---|---|---|
| 9,276,055 B1 * | 3/2016 | Son ...................... | H01L 27/3288 |
| 10,475,874 B2 * | 11/2019 | Rhe ...................... | H01L 51/0097 |

(Continued)

FOREIGN PATENT DOCUMENTS

| | | |
|---|---|---|
| KR | 10-2012-0060926 | 6/2012 |
| KR | 10-2017-0106621 | 9/2017 |
| KR | 10-2017-0113757 | 10/2017 |

*Primary Examiner* — Sardis F Azongha
(74) *Attorney, Agent, or Firm* — Lewis Roca Rothgerber Christie LLP

(57) ABSTRACT

An organic light emitting display device includes a display panel and a touch screen. The display panel includes a display region that includes a light emitting region and a peripheral region surrounding the light emitting region, a pad region spaced apart from the display region, and a bending region located between the display region and the pad region. The touch screen is positioned on the display panel and includes a plurality of touch screen electrodes and an organic insulation structure. The plurality of touch screen electrodes is located in the display region. The organic insulation structure is positioned to cover the plurality of touch screen electrodes in the display region, and extends in a first direction from the display region into the bending region and the pad region.

20 Claims, 16 Drawing Sheets

(56) References Cited

U.S. PATENT DOCUMENTS

| | | | | |
|---|---|---|---|---|
| 10,483,098 B2* | 11/2019 | Um | ............... | H01L 27/1262 |
| 10,510,821 B2* | 12/2019 | Jo | ............... | H01L 25/18 |
| 2017/0263887 A1* | 9/2017 | Han | ............... | H01L 51/0097 |
| 2017/0277288 A1* | 9/2017 | Choi | ............... | H01L 51/0097 |
| 2017/0278901 A1* | 9/2017 | Kim | ............... | H01L 51/0097 |
| 2017/0288007 A1* | 10/2017 | Shin | ............... | H01L 51/56 |
| 2018/0032189 A1 | 2/2018 | Lee et al. | | |
| 2018/0321764 A1* | 11/2018 | Oh | ............... | G06F 3/044 |
| 2018/0342707 A1* | 11/2018 | Lee | ............... | H01L 51/56 |
| 2019/0129567 A1* | 5/2019 | Rhe | ............... | H01L 27/3276 |

\* cited by examiner

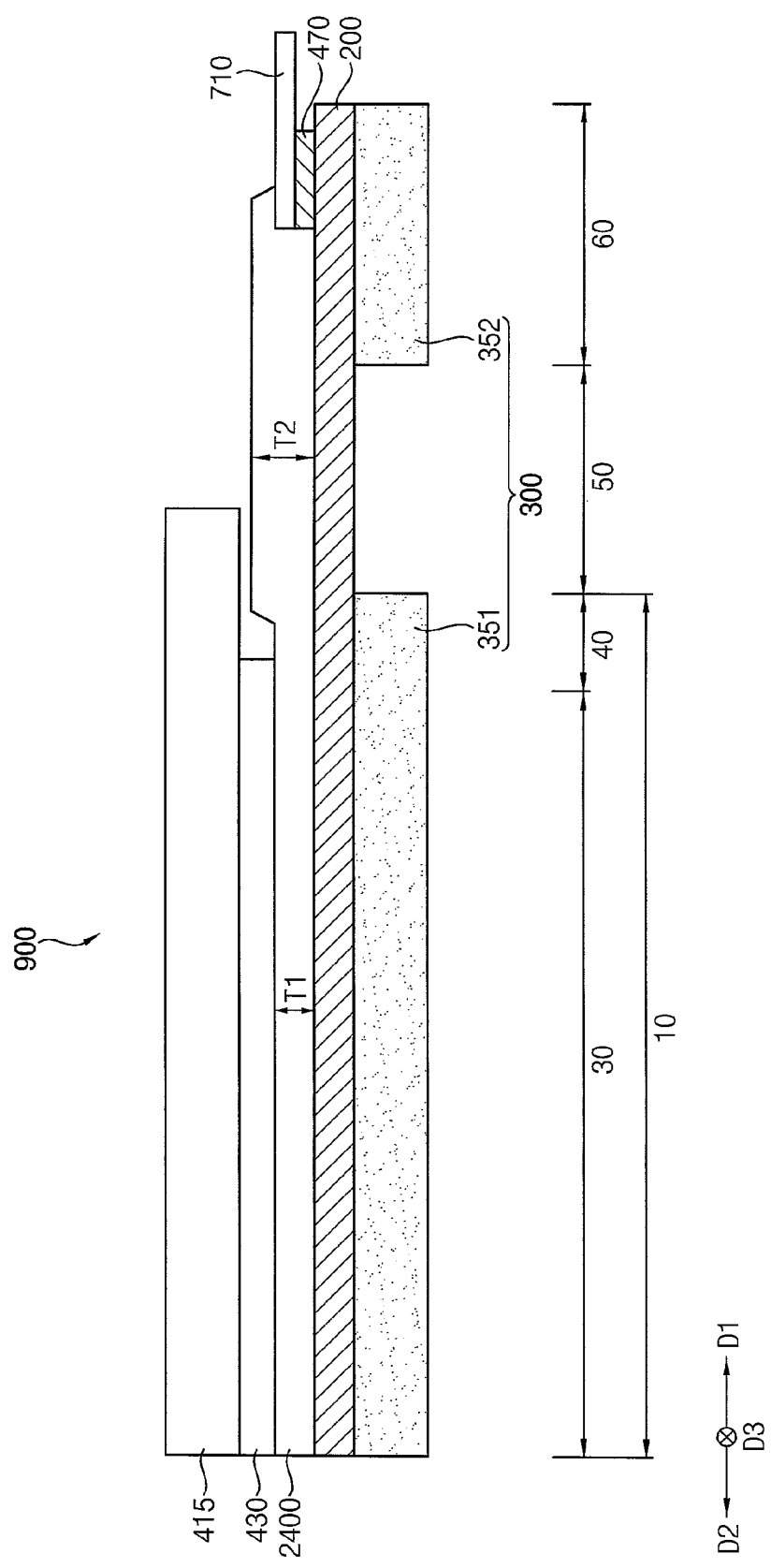

ORGANIC LIGHT EMITTING DISPLAY DEVICE

CROSS-REFERENCE TO RELATED APPLICATION

This application claims priority to and the benefit of Korean Patent Applications No. 10-2018-0044959, filed on Apr. 18, 2018 in the Korean Intellectual Property Office (KIPO), the entire content of which is incorporated herein by reference.

BACKGROUND

1. Field

One or more aspects of embodiments of the present disclosure are directed toward an organic light emitting display device. One or more embodiments of the present inventive concept are directed toward a flexible organic light emitting display device.

2. Description of the Related Art

A flat panel display ("FPD") device is widely used as a display of an electronic device, because the FPD device is lightweight and thin compared to a cathode-ray tube ("CRT") display device, for example. Examples of the FPD device include a liquid crystal display ("LCD") device and an organic light emitting display ("OLED") device.

Recently, a flexible OLED device including lower and upper substrates having flexible materials and capable of bending and/or folding a portion of a display panel included in the OLED device has been developed. For example, the lower substrate included in the display panel may be formed of a flexible substrate, and the upper substrate included in the display panel may have a thin film encapsulation structure. In addition, the flexible OLED device may further include a bending protection layer, a polarizing layer, a touch screen electrode layer, and/or the like. Here, the bending protection layer may raise a neutral plane of the display panel in a portion where the display panel is bent, and the polarizing layer and the touch screen electrode layer may be disposed on the display panel. A lower protection film may be disposed (e.g., positioned) under the display panel.

SUMMARY

One or more aspects of embodiments of the present disclosure are directed toward an organic light emitting display ("OLED") device.

According to some of example embodiments, an OLED device includes a display panel and a touch screen. The display panel includes a display region that includes a light emitting region and a peripheral region around the light emitting region, a pad region spaced from the display region, and a bending region between the display region and the pad region. The touch screen is positioned on the display panel and includes a plurality of touch screen electrodes and an organic insulation structure. The plurality of touch screen electrodes are located in the display region. The organic insulation structure covers the plurality of touch screen electrodes in the display region, and extends in a first direction from the display region into the bending region and the pad region.

In example embodiments, the organic insulation structure may be continuous in the display region, the bending region, and a portion of the pad region on the display panel.

In example embodiments, the plurality of touch screen electrodes may include a plurality of first touch screen electrodes and a plurality of second touch screen electrodes. The plurality of first touch screen electrodes may extend in the first direction and a second direction opposite to the first direction, and may be spaced from each other in a third direction crossing the first and second directions. The plurality of second touch screen electrodes are on the plurality of first touch screen electrodes, and may extend in the third direction. The plurality of second touch screen electrodes are spaced from each other in the second direction. The plurality of first touch screen electrodes may respectively cross the plurality of second touch screen electrodes.

In example embodiments, the organic insulation structure may include a first organic insulation layer and a second organic insulation layer. The first organic insulation layer may cover the plurality of first touch screen electrodes, and may extend in the first direction. The second organic insulation layer may be on the first organic insulation layer, may cover the plurality of second touch screen electrodes and may extend in the first direction.

In example embodiments, the organic insulation structure may further include a third organic insulation layer under the plurality of first touch screen electrodes and the first organic insulation layer.

In example embodiments, the first, second, and third organic insulation layers may each independently consist essentially of organic materials.

In example embodiments, the second organic insulation layer may have a first thickness in the light emitting region, and may have a second thickness in the bending region, the second thickness being greater than the first thickness.

In example embodiments, the second thickness of the second organic insulation layer may be such that a neutral plane of the display panel in the bending region is raised.

In example embodiments, the plurality of touch screen electrodes may include a plurality of first touch screen electrodes, a plurality of second touch screen electrodes, and a plurality of connection patterns. The plurality of first touch screen electrodes may extend in the first direction and a second direction opposite to the first direction, and may be spaced apart from each other in a third direction crossing the first and second directions. The plurality of second touch screen electrodes may be at a same layer level with the plurality of first touch screen electrodes, and may be spaced apart from each other in the first and second directions, each of the plurality of second touch screen electrodes being between adjacent two of the plurality of first touch screen electrodes. The plurality of connection patterns may be at a different layer level than the first and second touch screen electrodes, and may electrically connect adjacent two of the plurality of second touch screen electrodes in the third direction.

In example embodiments, the organic insulation structure may include a first organic insulation layer and a second organic insulation layer. The first organic insulation layer may cover the plurality of first and second touch screen electrodes, and may extend in the first direction. The second organic insulation layer may be on the first organic insulation layer, may cover the plurality of connection patterns, and may extend in the first direction.

In example embodiments, the organic insulation structure may further include a third organic insulation layer under the plurality of first touch screen electrodes and the first organic insulation layer. The first, second, and third organic insulation layers may each independently consist essentially of organic materials.

In example embodiments, the display panel may further include a substrate, a semiconductor element on the substrate, a light emitting structure in the light emitting region on the substrate, and a thin film encapsulation structure on the light emitting structure.

In example embodiments, the semiconductor element may include an active layer on the substrate, a gate insulation layer covering the active layer on the substrate and extending in the first direction, a gate electrode on the active layer, an insulating interlayer covering the gate electrode on the gate insulation layer and extending in the first direction, and source and drain electrodes on the gate electrode.

In example embodiments, the gate insulation layer may have a first opening exposing an upper surface of the substrate in the bending region, and the insulating interlayer may have a second opening exposing the upper surface of the substrate in the bending region.

In example embodiments, the light emitting structure may include a lower electrode, a light emitting layer on the lower electrode, and an upper electrode on the light emitting layer. The thin film encapsulation structure may include a first thin film encapsulation layer, a second thin film encapsulation layer, and a third thin film encapsulation layer. The first thin film encapsulation layer may include one or more inorganic materials having flexibility. The second thin film encapsulation layer may be on the first thin film encapsulation layer, and may include one or more organic materials having flexibility. The third thin film encapsulation layer may be on the second thin film encapsulation layer, and may include one or more inorganic materials having flexibility.

In example embodiments, the touch screen may be directly on the thin film encapsulation structure.

In example embodiments, the OLED device may further include at least one connection electrode. The at least one connection electrode may be between the organic insulation structure of the touch screen and the substrate, and may electrically connect the light emitting structure and an external device.

In example embodiments, the OLED device may further include a lower protection film on a lower surface of the display panel, opposite from the touch screen, a polarizing layer on the touch screen, and a window substrate on the polarizing layer.

In example embodiments, the lower protection film may include a first lower protection film pattern in the display region and a second lower protection film pattern in the pad region, wherein the lower surface of the display panel located in the bending region is exposed.

In example embodiments, when viewed in a fourth direction crossing the first and second directions and being normal (e.g., perpendicular) to an upper surface of the substrate, the bending region may be bent around an axis extending along a third direction, crossing the first, second, and fourth directions. When the bending region is bent, the second lower protection film pattern may be on a lower surface of the first lower protection film pattern in the fourth direction.

As the OLED device according to example embodiments includes the organic insulation structure included in the touch screen, the organic insulation structure may be positioned in the bending region and may be utilized instead of a bending protection layer of a comparable OLED device. That is, the organic insulation structure may be disposed (e.g., positioned) in the bending region such that a neutral plane in the bending region is located at a portion where the connection electrode is disposed. Accordingly, even when the bending region is bent, a cut of the connection electrode might not occur in the bending region. In addition, since the bending protection layer is not disposed, an adhesion failure of a cover window might not occur. A dead space (e.g., a non-display region) of the OLED device may be relatively decreased because a length of the peripheral region is relatively reduced. Further, since the bending protection layer is not disposed, a manufacturing cost of the OLED device may be relatively reduced.

BRIEF DESCRIPTION OF THE DRAWINGS

Example embodiments can be understood in more detail from the following description taken in conjunction with the accompanying drawings, in which:

FIG. 16 is a cross sectional view illustrating an OLED device in accordance with example embodiments.

DETAILED DESCRIPTION

Hereinafter, embodiments of the present inventive concept will be explained in more detail with reference to the accompanying drawings.

Figure 1:
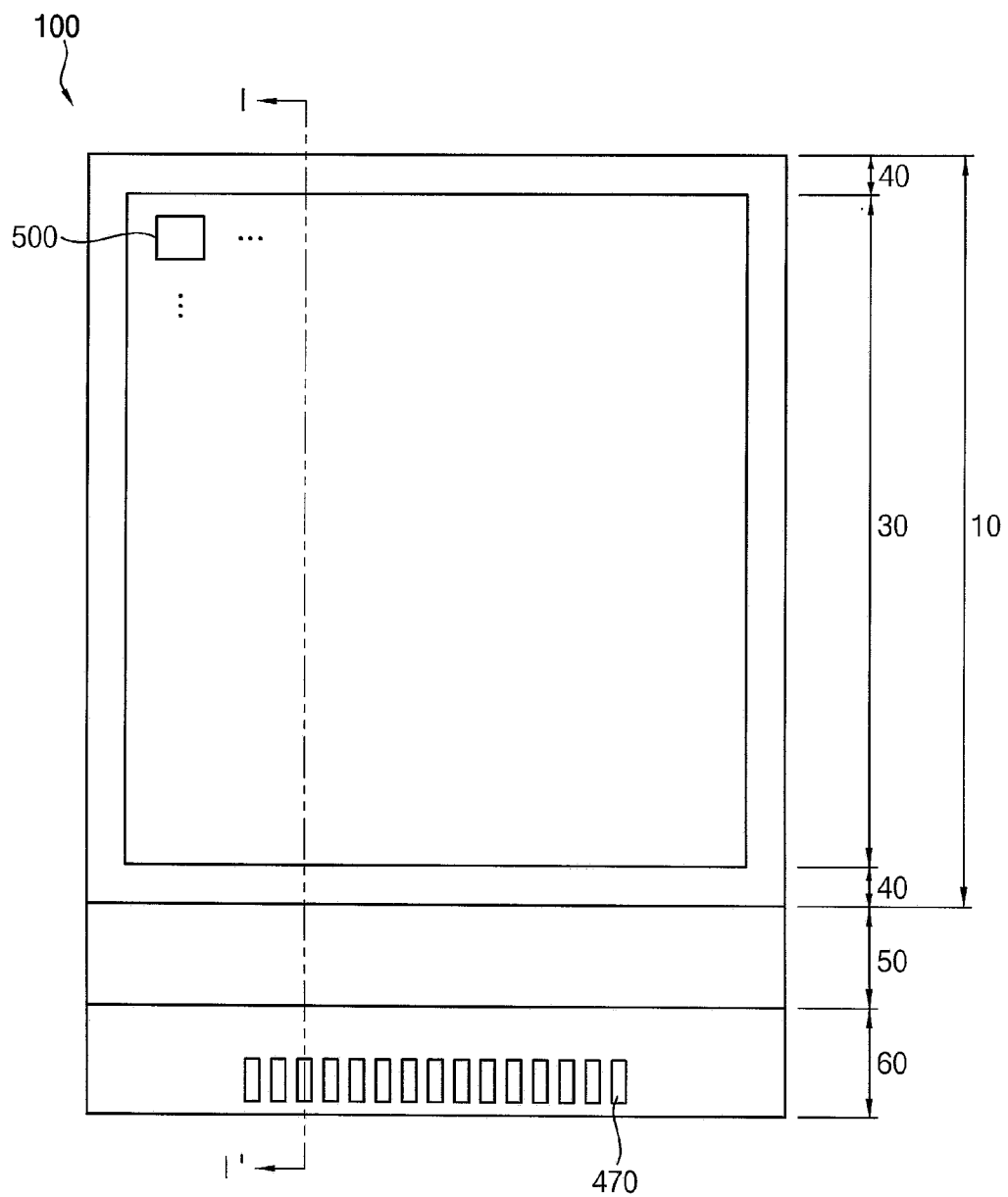
FIG. 1 is a plan view illustrating an organic light emitting display ("OLED") device in accordance with example embodiments.
Figure 2:
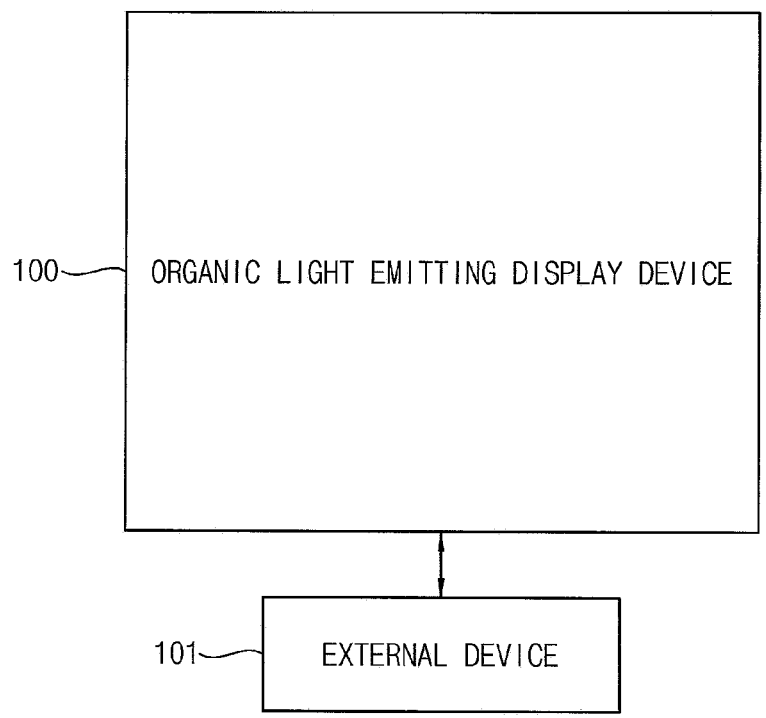
FIG. 2 is a block diagram for describing an external device electrically connected to the OLED device of FIG. 1.
Figure 3:
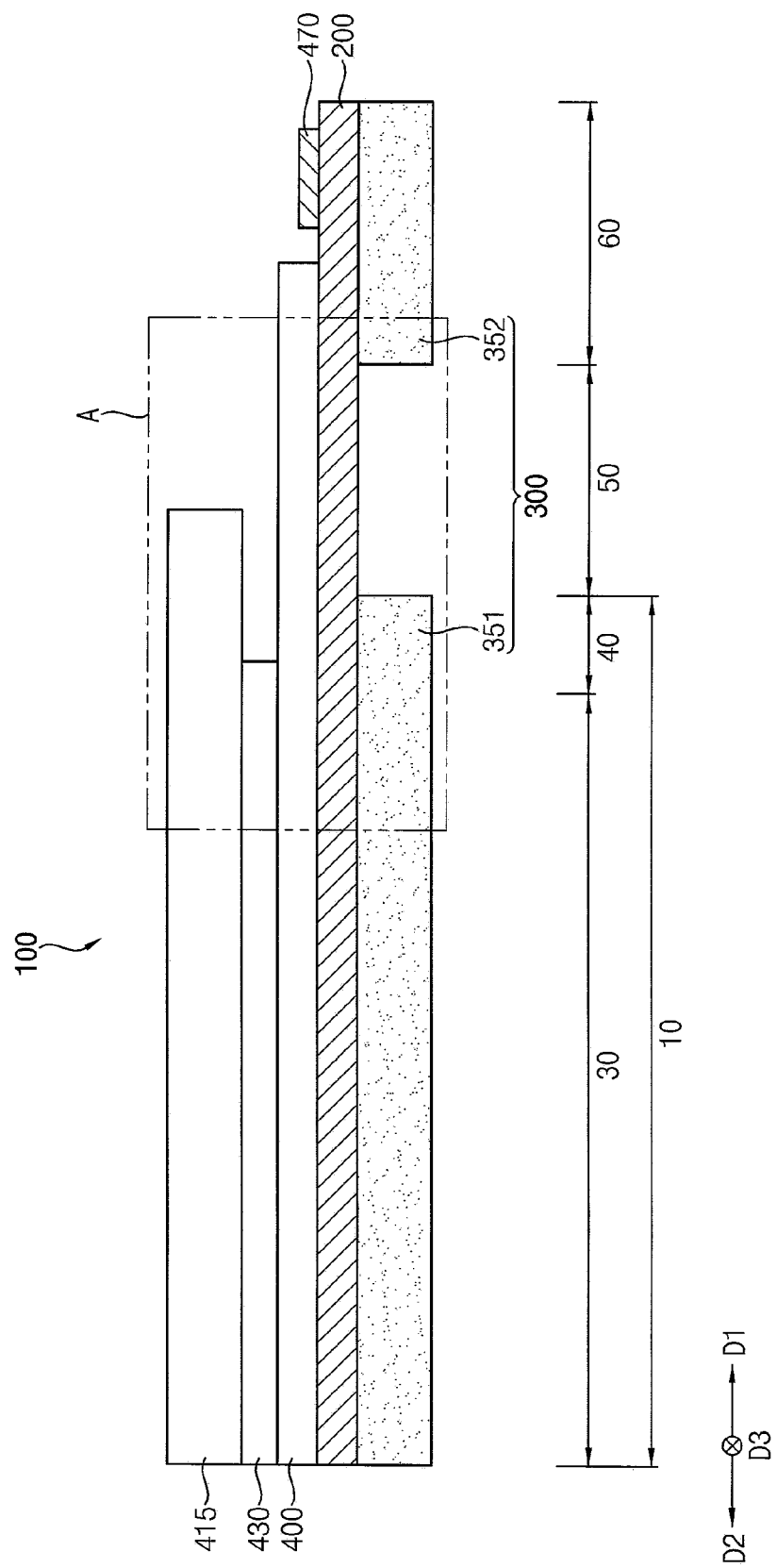
FIG. 3 is a cross-sectional view taken along a line I-I' of FIG. 1.

FIG. 1 is a plan view illustrating an organic light emitting display ("OLED") device in accordance with example embodiments, and FIG. 2 is a block diagram for describing an external device electrically connected to the OLED device of FIG. 1. FIG. 3 is a cross-sectional view taken along a line I-I' of FIG. 1.

Referring to FIGS. 1, 2, and 3, an OLED device 100 may include a display panel 200 including a plurality of light emitting structures 500, a touch screen 400, a polarizing layer 430, a lower protection film 300, a cover window 415, and a pad electrode 470, without limitation.

The display panel 200 may have a display region 10, a bending region 50, and a pad region 60. The pad region 60 may be spaced apart from the display region 10, and the bending region 50 may be located between the display region 10 and the pad region 60. The pad electrode 470 may be electrically connected (or coupled) to an external device 101 and may be disposed in the pad region 60.

The display region 10 may include a light emitting region 30 where light is emitted and a peripheral region 40 surrounding the light emitting region 30. In example embodiments, the light emitting structure 500 (e.g., a light emitting structure 500 of FIG. 4) capable of emitting light may be disposed in the light emitting region 30, and a plurality of wirings may be disposed in the peripheral region 40. The wirings may electrically connect pad electrode 470 and the light emitting structure 500. For example, the wirings may include data signal wirings, scan signal wirings, light emission wirings, initialization signal wiring, power supply wirings, and/or the like. In addition, a scan driver, a data driver, and/or the like may be disposed in the peripheral region 40. A portion of the peripheral region 40 (e.g., a peripheral region 40 of FIG. 4) may be interposed between the light emitting region 30 and the bending region 50.

In example embodiments, a width of the peripheral region 40 surrounding the light emitting region 30 of FIG. 1 may be the same along the entire the peripheral region 40, but is not limited thereto. For example, the peripheral region 40 may include a first region extending in a third direction D3 (that corresponds to a row direction in a plan view of the OLED device 100) and a second region extending in a first direction D1 or a second direction D2 (that correspond to a column direction in a plan view of the OLED device 100). In other words, the first region of the peripheral region 40 may be located adjacent to the bending region 50 and to a top side of the display panel 200 (as shown in FIG. 1), opposite from the bending region 50, and the second region of the peripheral region 40 may be located at both lateral portions (sides) of the display panel 200 (e.g., left and right sides of the display panel 200 as shown in FIG. 1). In some embodiments, a width (in the row direction) of the second region may be less than a width (in the column direction) of the first region. As the bending region 50 is bent, the pad region 60 may be located on a lower surface of the OLED device 100 (refer to FIG. 7).

In some embodiments, a shape of the display region 10, the peripheral region 40, the bending region 50, and the pad region 60 may each be a plan shape of a tetragon, but not being limited thereto. For example, the shape of the display region 10, the peripheral region 40, the bending region 50, and the pad region 60 may each independently be a plan shape of a triangle, a plan shape of a rhombus, a plan shape of a polygon, a plan shape of a circle, a plan shape of an athletic track, and/or a plan shape of an oval.

In example embodiments, the OLED device 100 may further include connection electrodes (e.g., a connection electrode 330 of FIG. 4), and the touch screen 400 may be continuously disposed in the light emitting region 30, the peripheral region 40 located between the light emitting region 30 and the bending region 50, the bending region 50, and a portion of the pad region 60 on the display panel 200. In some embodiments, the touch screen 400 may be disposed directly on the display panel 200. The connection electrodes may be disposed between the touch screen 400 and a substrate (e.g., a substrate 110 of FIG. 4) included in the display panel 200, and may electrically connect the wirings and the pad electrode 470. The light emitting structure 500 disposed in the light emitting region 30 and the external device 101 electrically connected to the pad electrode 470 may be electrically connected through the connection electrodes disposed in the bending region 50 and the wirings disposed in the peripheral region 40. The external device 101 may be electrically connected to the OLED device 100 through a flexible printed circuit board (FPCB). The external device 101 may provide a data signal, a scan signal, a light emission signal, a power supply voltage, a touch sensing voltage, and/or the like to the OLED device 100. In some embodiments, a driving integrated circuit may be mounted (e.g., installed) in the FPCB. In some example embodiments, the driving integrated circuit may be mounted in the pad region 60 of the display panel 200 that is located adjacent to the pad electrodes 470.

The polarizing layer 430 may be disposed in the display region 10 on the touch screen 400. The polarizing layer 430 may block or reduce an external light incident from an outside onto the display panel 200. In example embodiments, the polarizing layer 430 may have a relatively small thickness.

The cover window 415 may be disposed on the polarizing layer 430. The cover window 415 may protect the polarizing layer 430, the touch screen 400, and the display panel 200.

The lower protection film 300 may be disposed on a lower surface of the display panel 200 (opposite from a surface of the display panel 200 adjacent to the touch screen 400), and may protect the display panel 200. In example embodiments, the lower protection film 300 may include a first lower protection film pattern 351 and a second lower protection film pattern 352. The first lower protection film pattern 351 may be disposed in the display region 10. The second lower protection film pattern 352 may be disposed in the pad region 60, and may be spaced apart from the first lower protection film pattern 351. For example, the lower protection film 300 may expose a portion of the lower surface of the display panel 200 located in the bending region 50.

Figure 4:
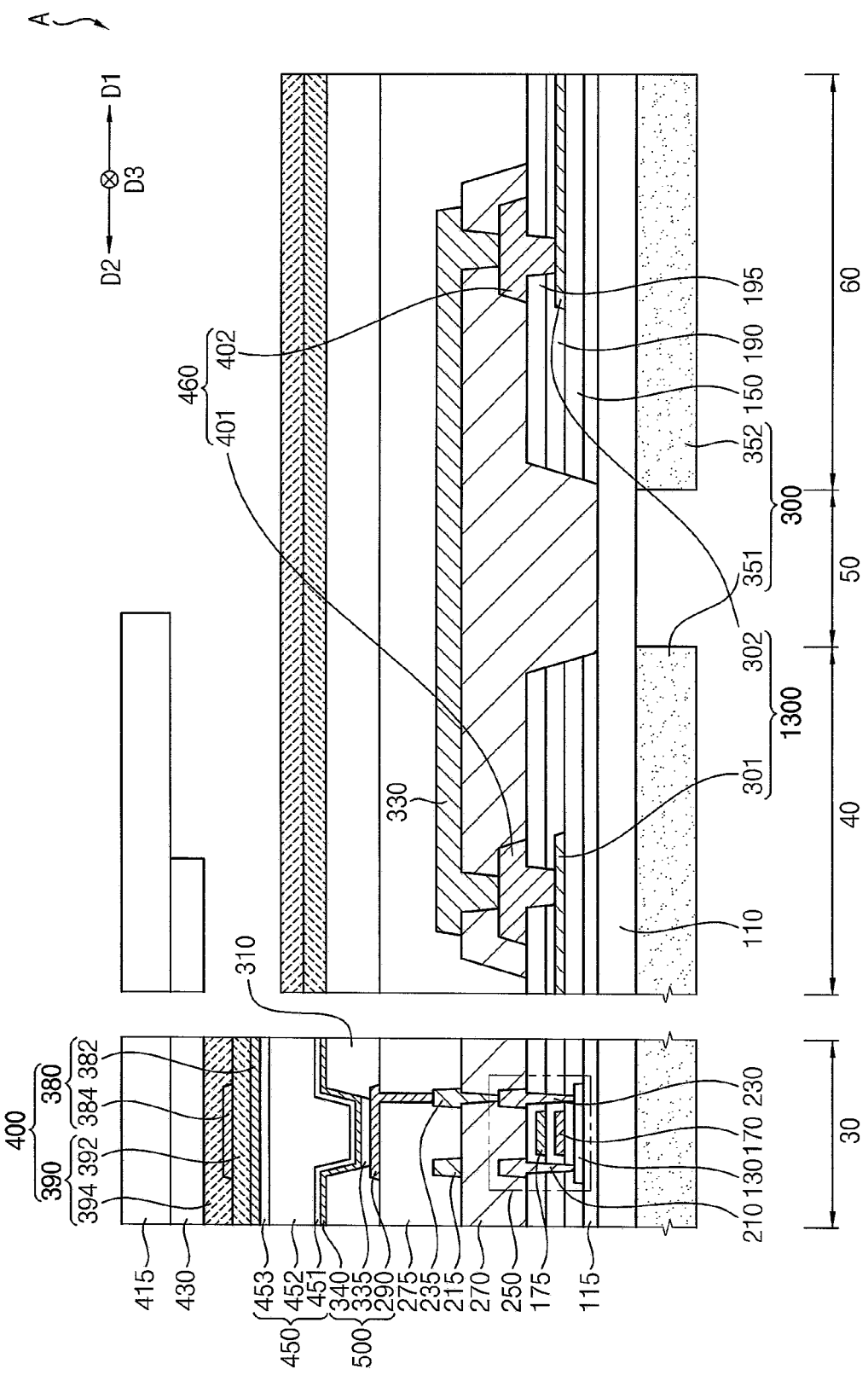
FIG. 4 is an enlarged cross-sectional view corresponding to region 'A' of FIG. 3.
Figure 5:
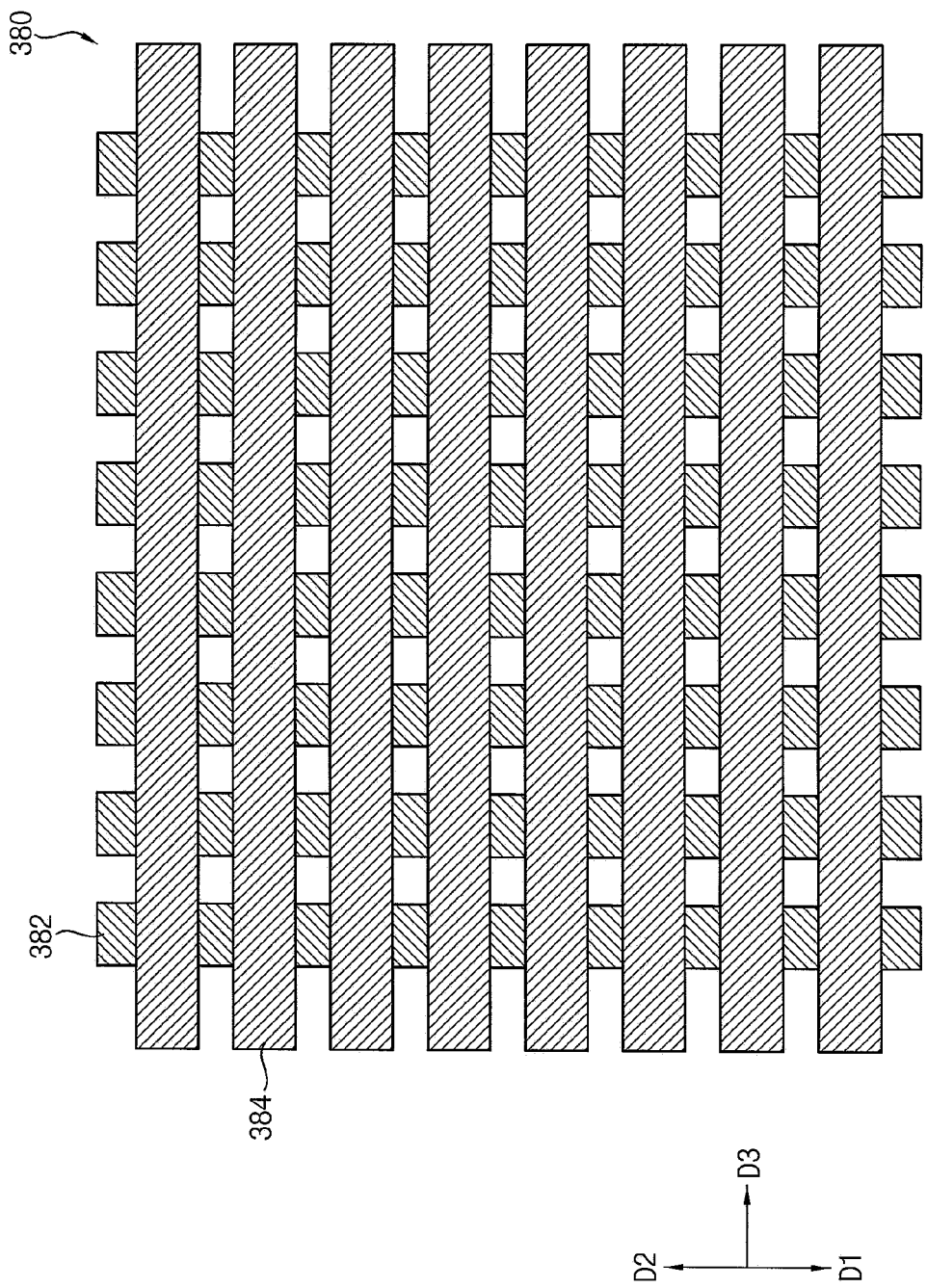
FIG. 5 is a plan view for describing a touch screen electrode included in the OLED device of FIG. 3.
Figure 6:
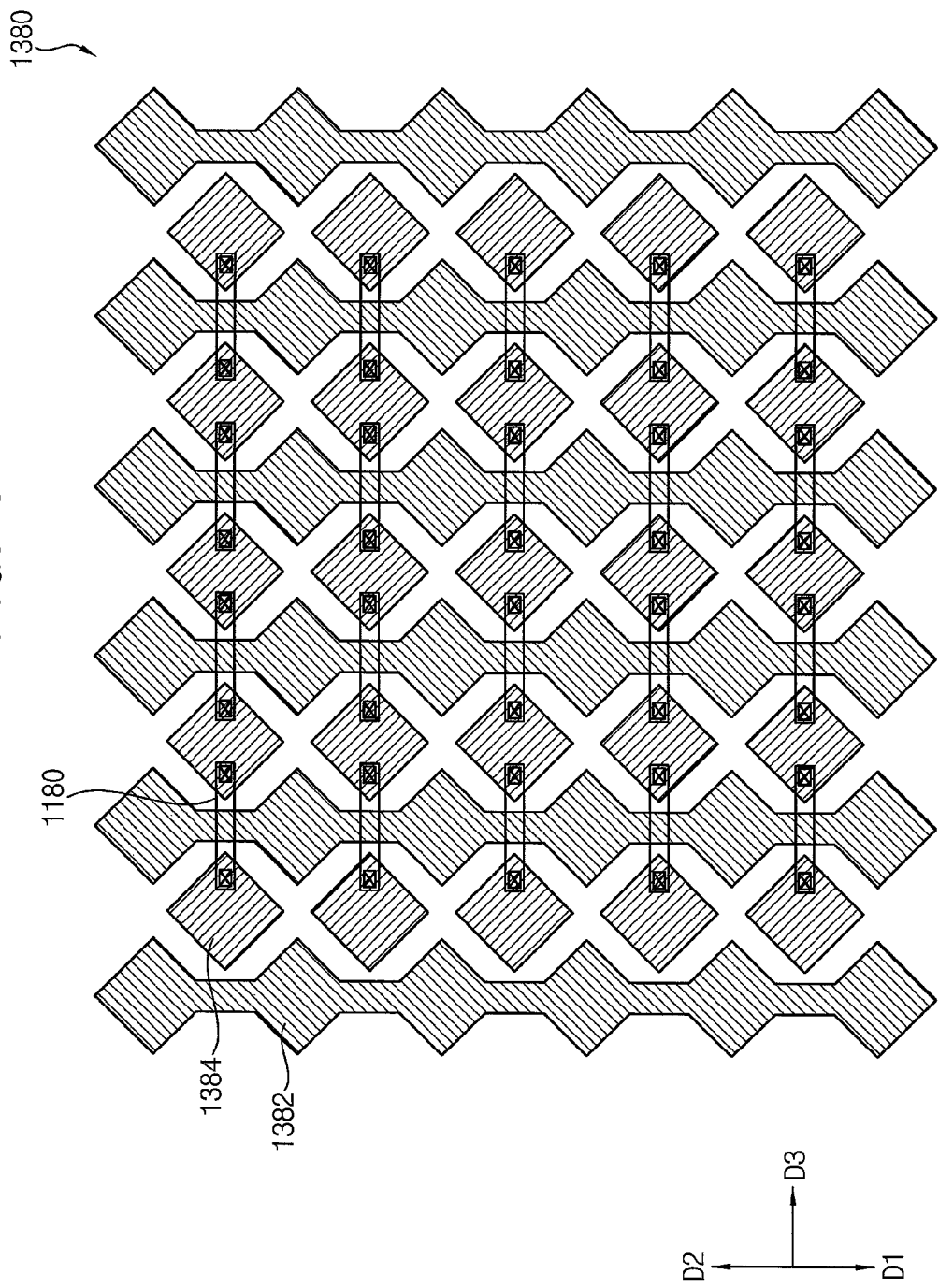
FIG. 6 is a plan view illustrating an example of a touch screen electrode included in the OLED device of FIG. 3.

FIG. 4 is an enlarged cross-sectional view corresponding to region 'A' of FIG. 3, and FIG. 5 is a plan view for describing a touch screen electrode included in the OLED device of FIG. 3. FIG. 6 is a plan view illustrating an example of a touch screen electrode included in the OLED device of FIG. 3.

Referring to FIG. 4, the OLED device 100 may include a display panel 200, a touch screen 400, a polarizing layer 430, a cover window 415, and a lower protection film 300, without limitation. The display panel 200 may include a substrate 110, a buffer layer 115, a semiconductor element 250, a light emitting structure 500, a fan-out wiring 1300, a conductive pattern 460, a first planarization layer 270, a second planarization layer 275, a connection electrode 330, a wiring pattern 215, a connection pattern 235, a pixel defining layer 310, and a thin film encapsulation (TFE) structure 450, without limitation. The semiconductor element 250 may include an active layer 130, a gate insulation layer 150, a first gate electrode 170, a first insulating inter layer 190, a second gate electrode 175, a second insulating interlayer 195, a source electrode 210, and a drain electrode 230. In some embodiments, the conductive pattern 460 may include a first conductive pattern 401 and a second conductive pattern 402, and the fan-out wiring 1300 may include a first fan-out wiring 301 and a second fan-out wiring 302. The light emitting structure 500 may include a lower electrode 290, a light emitting layer 335, and an upper electrode 340. The TFE structure 450 may include a first TFE layer 451, a second TFE layer 452, and a third TFE layer 453, and the lower protection film 300 may include a first lower protection film pattern 351 and a second lower protection film pattern 352.

In example embodiments, the touch screen 400 may include a touch screen electrode 380 and an organic insulation structure 390. The touch screen electrode 380 may include a first touch screen electrode 382 and a second touch screen electrode 384, and the organic insulation structure 390 may include a first organic insulation layer 392 and a second organic insulation layer 394.

In the present embodiments, the OLED device 100 including the substrate 110 and the TFE structure 450 that both have flexibility may be bent on an axis with respect to the third direction D3, and the OLED device 100 may serve as a flexible OLED device having a shape where the bending region 50 is bent.

The substrate 110 may include transparent and/or opaque insulation materials. For example, the substrate 110 may include a flexible transparent resin substrate. In example embodiments, the substrate 110 may have a configuration where a first organic layer, a first barrier layer, a second organic layer, and a second barrier layer are sequentially stacked. The first barrier layer and the second barrier layer may each independently include inorganic materials such as silicon oxide, and may block or reduce moisture and/or water that may permeate through the first and second organic layers. In some embodiments, each of the first and second organic layers may include organic materials such as a polyimide-based resin.

Since the substrate 110 is relatively thin and flexible, the substrate 110 may be disposed on a rigid glass substrate to help support the formation of the semiconductor element 250 and the light emitting structure 500. In some embodiments, during manufacturing of the OLED device 100, after the buffer layer 115 is provided on the second barrier layer of the substrate 110, the semiconductor element 250 and the light emitting structure 500 may be disposed on the buffer layer 115. After the semiconductor element 250 and the light emitting structure 500 are formed on the buffer layer 115, the rigid glass substrate on which the substrate 110 is disposed may be removed. In other words, since it may be difficult to directly form the semiconductor element 250 and the light emitting structure 500 on the relatively thin and flexible substrate 110, the semiconductor element 250 and the light emitting structure 500 may be formed on the substrate 110 and the rigid glass substrate, and then the rigid glass substrate may be removed, leaving the substrate 110 including the first organic layer, the first barrier layer, the second organic layer, and the second barrier layer to serve as the substrate 110 of the OLED device 100.

In embodiments where the display panel 200 includes the display region 10 including the light emitting region 30 and the peripheral region 40, the bending region 50, and the pad region 60 (as illustrated in FIG. 4, for example), the substrate 110 may be divided into the light emitting region 30, the peripheral region 40 (e.g., the peripheral region 40 interposed between the light emitting region 30 and the bending region 50), the bending region 50, and the pad region 60 (refer to FIG. 1).

In some embodiments, the substrate 110 may include a quartz substrate, a synthetic quartz substrate, a calcium fluoride substrate, a fluoride-doped quartz substrate, a sodalime glass substrate, a non-alkali glass substrate, and/or the like.

In example embodiments, the substrate 110 includes four layers, but not being limited thereto. For example, in some example embodiments, the substrate 110 may include a single layer or a plurality of layers.

The buffer layer 115 may be disposed on the substrate 110. In example embodiments, the buffer layer 115 may be entirely disposed in the light emitting region 30, the peripheral region 40, and the pad region 60 on the substrate 110, and may have a first opening exposing a portion of an upper surface of the substrate 110 that is located in the bending region 50. The buffer layer 115 may prevent or reduce the diffusion of metal atoms and/or impurities from the substrate 110 into the semiconductor element 250. In addition, the buffer layer 115 may control a rate of a heat transfer in a crystallization process for forming the active layer 130, thereby obtaining substantially uniform active layer. Further, the buffer layer 115 may improve a surface flatness of the substrate 110 when a surface of the substrate 110 is relatively irregular. Depending on a type (or kind) of the substrate 110, at least two buffer layers 115 may be provided on the substrate 110, or the buffer layer might not be disposed. The buffer layer 115 may include silicon compound, metal oxide, and/or the like. For example, the buffer layer 115 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), and/or the like.

The active layer 130 may be disposed in the light emitting region 30 on the buffer layer 115. The active layer 130 may include an oxide semiconductor, an inorganic semiconductor (e.g., amorphous silicon, polysilicon, and/or the like.), an organic semiconductor, and/or the like.

The gate insulation layer 150 may be disposed on the active layer 130. The gate insulation layer 150 may cover the active layer 130 in the light emitting region 30 on the buffer layer 115, and may extend in the first direction D1 from the light emitting region 30 into the pad region 60. For example, the gate insulation layer 150 may sufficiently (or suitably) cover the active layer 130 on the buffer layer 115, and may have a substantially flat upper surface without a step around the active layer 130. In some embodiments, the gate insulation layer 150 may cover the active layer 130 on the buffer layer 115, and may have a substantially uniform thickness along a profile of the active layer 130. In example embodiments, the gate insulation layer 150 may be disposed in the light emitting region 30, the peripheral region 40, and the pad region 60 on the buffer layer 115, and may have a second opening exposing the portion of the upper surface of the substrate 110 that is located in the bending region 50. The gate insulation layer 150 may include silicon compound, metal oxide, and/or the like.

The first gate electrode 170 may be disposed in the light emitting region 30 on the gate insulation layer 150. The first gate electrode 170 may be disposed on a portion of the gate insulation layer 150 under which the active layer 130 is located. The first gate electrode 170 may include a metal, a metal alloy, metal nitride, conductive metal oxide, transparent conductive materials, and/or the like. For example, the first gate electrode 170 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chromium nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), and/or the like. These materials may be used alone or in a suitable combination thereof. In some example embodiments, the first gate electrode 170 may have a multi-layered structure including a plurality of layers.

The fan-out wiring 1300 may be disposed on the gate insulation layer 150 in the peripheral and pad regions 40 and 60 that are located adjacent to (and on both sides of) the bending region 50. As described above, the fan-out wiring 1300 may include the first fan-out wiring 301 and the second fan-out wiring 302. The first fan-out wiring 301 may extend along the second direction D2 in the peripheral region 40 on the gate insulation layer 150, and may be electrically connected to the light emitting structure 500 that is disposed in the light emitting region 30. The second fan-out wiring 302 may extend along the first direction D1 in the pad region 60 on the gate insulation layer 150, and may be electrically connected to an external device 101 through pad electrodes 470 that are disposed in the pad region 60 (refer e.g., to FIGS. 1 and 2). The fan-out wiring 1300 may include a metal, a metal alloy, metal nitride, conductive metal oxide, transparent conductive materials, and/or the like. In example embodiments, the fan-out wiring 1300 and the first gate electrode 170 may be located at a same layer (e.g., on a same level), and may be simultaneously (or concurrently) formed using the same materials. In some embodiments, the fan-out wiring 1300 and the second gate electrode 175 may be located at the same layer (e.g., at the same layer level). These may be used alone or in a suitable combination thereof. In some example embodiments, the fan-out wiring 1300 may have a multi-layered structure including a plurality of layers.

The first insulating interlayer 190 may be disposed on the first gate electrode 170. The first insulating interlayer 190 may cover the first gate electrode 170 in the light emitting region 30 on the gate insulation layer 150, and may extend in the first direction D1. In addition, the first insulating interlayer 190 may cover the first fan-out wiring 301 in the peripheral region 40 and the second fan-out wiring 302 in the pad region 60 on the gate insulation layer 150. For example, the first insulating interlayer 190 may sufficiently (or suitably) cover the first gate electrode 170, the first fan-out wiring 301, and the second fan-out wiring 302 on the gate insulation layer 150, and may have a substantially flat upper surface without a step around the first gate electrode 170, the first fan-out wiring 301, and/or the second fan-out wiring 302. In some embodiments, the first insulating interlayer 190 may cover the first gate electrode 170, the first fan-out wiring 301, and the second fan-out wiring 302 on the gate insulation layer 150, and may be disposed to have a substantially uniform thickness along a profile of the first gate electrode 170, the first fan-out wiring 301, and the second fan-out wiring 302. In example embodiments, the first insulating interlayer 190 may be disposed in the light emitting region 30, the peripheral region 40, and the pad region 60 on the gate insulation layer 150, and may have a third opening exposing the portion of the upper surface of the substrate 110 that is located in the bending region 50. The first insulating interlayer 190 may include silicon compound, metal oxide, and/or the like.

The second gate electrode 175 may be disposed in the light emitting region 30 on the first insulating interlayer 190. The second gate electrode 175 may be disposed on a portion of the first insulating interlayer 190 under which the first gate electrode 170 is located. In some embodiments, the first gate electrode 170 and the second gate electrode 175 may serve as a storage capacitor. The second gate electrode 175 may include a metal, a metal alloy, metal nitride, conductive metal oxide, transparent conductive materials, and/or the like. These may be used alone or in a suitable combination thereof. In some example embodiments, the second gate electrode 175 may have a multi-layered structure including a plurality of layers.

The second insulating interlayer 195 may be disposed on the second gate electrode 175. The second insulating interlayer 195 may cover the second gate electrode 175 in the light emitting region 30 on the first insulating interlayer 190, and may extend in the first direction D1. For example, the second insulating interlayer 195 may sufficiently (or suitably) cover the second gate electrode 175 on the first insulating interlayer 190, and may have a substantially flat upper surface without a step around the second gate electrode 175. In some embodiments, the second insulating interlayer 195 may cover the second gate electrode 175 on the first insulating interlayer 190, and may be disposed to have a substantially uniform thickness along a profile of the second gate electrode 175. In example embodiments, the second insulating interlayer 195 may be disposed in the light emitting region 30, the peripheral region 40, and the pad region 60 on the first insulating interlayer 190, and may have a fourth opening exposing the portion of the upper surface of the substrate 110 that is located in the bending region 50. Here, the first through fourth openings may be overlapped with each other. The second insulating interlayer 195 may include a silicon compound, a metal oxide, and/or the like.

The source electrode 210 and the drain electrode 230 may be disposed in the light emitting region 30 on the second insulating interlayer 195. The source electrode 210 may be in direct contact with a source region of the active layer 130 via a contact hole formed by removing a portion of the gate insulation layer 150, the first insulating interlayer 190, and the second insulating interlayer 195. The drain electrode 230 may be in direct contact with a drain region of the active layer 130 via a contact hole formed by removing another portion of the gate insulation layer 150, the first insulating interlayer 190, and the second insulating interlayer 195. The source electrode 210 and the drain electrode 230 may each independently include a metal, an alloy, metal nitride, conductive metal oxide, transparent conductive materials, and/or the like. These may be used alone or in a suitable combination thereof. In some example embodiments, the source and drain electrodes 210 and 230 may each independently have a multi-layered structure including a plurality of layers. Accordingly, the semiconductor element 250 including the active layer 130, the gate insulation layer 150, the first gate electrode 170, the first insulating interlayer 190, the second gate electrode 175, the second insulating interlayer 195, the source electrode 210, and the drain electrode 230 may be constituted (e.g., formed).

In example embodiments, the semiconductor element 250 has a top gate structure, but not being limited thereto. For example, in some example embodiments, the semiconductor element 250 may have a bottom gate structure.

In example embodiments, the OLED device 100 includes one semiconductor element, but not being limited thereto. For example, in some example embodiments, the OLED device 100 may include at least one semiconductor element 250 and at least one storage capacitor.

The conductive pattern 460 may be disposed in the peripheral and pad regions 40 and 60, that are located adjacent to the bending region 50, on the second insulating interlayer 195. As described above, the conductive pattern 460 may include a first conductive pattern 401 and a second conductive pattern 402. The first conductive pattern 401 may be in direct contact with the first fan-out wiring 301 via a first contact hole in the peripheral region 40 formed by removing a first portion of the first insulating interlayer 190 and the second insulating interlayer 195, and the second conductive pattern 402 may be in direct contact with the second fan-out wiring 302 via a second contact hole in the pad region 60 formed by removing a second portion of the first insulating interlayer 190 and the second insulating interlayer 195. In example embodiments, the conductive pattern 460, the source electrode 210, and the drain electrode 230 may be located at the same layer (e.g., at the same layer level), and may be simultaneously (or concurrently) formed using the same materials. In some embodiments, the conductive pattern 460 and the second gate electrode 175 may be located at the same layer (e.g., at the same layer level). The conductive pattern 460 may include a metal, an alloy of a metal, metal nitride, conductive metal oxide, transparent conductive materials, and/or the like. These may be used alone or in a suitable combination thereof. In some example embodiments, the conductive pattern 460 may have a multi-layered structure including a plurality of layers.

The first planarization layer 270 may be disposed on the second insulating interlayer 195, the source electrode 210, the drain electrode 230, and the conductive pattern 460. The first planarization layer 270 may cover the source and drain electrodes 210 and 230 in the light emitting region 30 on the second insulating interlayer 195, and may cover the conductive pattern 460 in the peripheral region 40 and the pad region 60 on the second insulating interlayer 195. In example embodiments, the first planarization layer 270 may be in direct contact with a lower surface of the connection electrode 330, side walls of each of the gate insulation layer 150, the first insulating interlayer 190, and the second insulating interlayer 195 that are located adjacent to the bending region 50 (e.g., side walls of the first through fourth openings), and the portion of the upper surface of the substrate 110 that is located in the bending region 50. In some embodiments, the first planarization layer 270 may completely (e.g., entirely) cover the conductive pattern 460. In other words, the first planarization layer 270 may be disposed under the connection electrode 330 in a portion of the peripheral region 40, the bending region 50, and a portion of the pad region 60 on the substrate 110, or may be disposed between the connection electrode 330 and the substrate 110. In some embodiments, the first planarization layer 270 may be entirely disposed in the light emitting region 30, the peripheral region 40, the bending region 50, and the pad region 60 on the substrate 110.

For example, the first planarization layer 270 may be disposed to have a relatively high thickness. In this case, the first planarization layer 270 may have a substantially flat upper surface, and a planarization process may be further performed on the first planarization layer 270 to implement the flat upper surface of the first planarization layer 270. In some embodiments, the first planarization layer 270 may cover the source and drain electrodes 210 and 230, the second insulating interlayer 195, and the side walls of the first through fourth openings, and may be disposed to have a substantially uniform thickness along a profile of the source and drain electrodes 210 and 230, the second insulating interlayer 195, and the side walls of the first through fourth openings. The first planarization layer 270 may include organic materials and/or inorganic materials. In example embodiments, the first planarization layer 270 may include organic materials.

The wiring pattern 215 and the connection pattern 235 may be disposed in the light emitting region 30 on the first planarization layer 270. Scan signals, data signals, light emission signals, initialization signals, power supply voltage, and/or the like may be transferred through the wiring pattern 215. The connection pattern 235 may be spaced apart from the wiring pattern 215 in the light emitting region 30 on the first planarization layer 270. The connection pattern 235 may be in contact with the drain electrode 230 via a contact hole formed by removing a portion of the first planarization layer 270 that is located in the light emitting region 30, and may electrically connect the lower electrode 290 and the drain electrode 230. The wiring pattern 215 and the connection pattern 235 may each independently include a metal, an alloy of a metal, metal nitride, conductive metal oxide, transparent conductive materials, and/or the like. These may be used alone or in a suitable combination thereof. In some example embodiments, the wiring pattern 215 and the connection pattern 235 may each independently have a multi-layered structure including a plurality of layers.

The connection electrode 330 may be disposed in a portion of the peripheral region 40, the bending region 50, and a portion of the pad region 60 on the first planarization layer 270. The connection electrode 330 may be in direct contact with the conductive pattern 460, and may be electrically connected to the fan-out wiring 1300. For example, the first planarization layer 270 may include a first contact hole that is located in the peripheral region 40 and a second contact hole that is located in the pad region 60. Here, the first contact hole of the first planarization layer 270 may expose a portion of the first conductive pattern 401, and the second contact hole of the first planarization layer 270 may expose the second conductive pattern 402. The connection electrode 330 may be in direct contact with the first conductive pattern 401 via the first contact hole of the first planarization layer 270 in the peripheral region 40, and may be in direct contact with the second conductive pattern 402 via the second contact hole of the first planarization layer 270 in the pad region 60. As the connection electrode 330 electrically connects the first fan-out wiring 301 and the second fan-out wiring 302 through the conductive pattern 460, scan signals, data signals, light emission signals, initialization signals, power supply voltage, and/or the like that are provided from the external device 101 may be applied to the light emitting structure 500. In example embodiments, the connection electrode 330, the wiring pattern 215, and the connection pattern 235 may be located at the same layer (e.g., at the same layer level), and may be simultaneously (or concurrently) formed using the same materials. The connection electrode 330 may include a metal, an alloy of a metal, metal nitride, conductive metal oxide, transparent conductive material, and/or the like. These may be used alone or in a suitable combination thereof. In some example embodiments, the connection electrode 330 may have a multi-layered structure including a plurality of layers.

The second planarization layer 275 may be disposed on the wiring pattern 215, the connection pattern 235, the connection electrode 330, and the first planarization layer 270. The second planarization layer 275 may cover the wiring pattern 215 and the connection pattern 235 in the light emitting region 30 on the first planarization layer 270 and extend in the first direction D1, and may cover the connection electrode 330 in the peripheral region 40, the bending region 50, and the pad region 60. That is, the second planarization layer 275 may be disposed on (or over) the entire (or substantially the entire) substrate 110.

In some embodiments, the OLED device 100 may further include a block region extending along the third direction D3 in a portion of the peripheral region 40 that is located between the light emitting region 30 and the bending region 50 (refer to FIG. 1). The block region may be located in parallel to the bending region 50, where the first planarization layer 270, the second planarization layer 275, and the pixel defining layer 310 might not be disposed in the block region. For example, the first planarization layer 270, the second planarization layer 275, and the pixel defining layer 310 might not be disposed in the block region so the block region can block (or reduce) water and/or moisture that may permeate into the light emitting region 30 through the first planarization layer 270 and the second planarization layer 275 that are disposed in the pad region 60 and/or the bending region 50.

The second planarization layer 275 may be disposed to have a high thickness to sufficiently (or suitably) cover the wiring pattern 215, the connection pattern 235, and the connection electrode 330. In this case, the second planarization layer 275 may have a substantially flat upper surface, and a planarization process may be further performed on the second planarization layer 275 to implement the flat upper surface of the second planarization layer 275. In some embodiments, the second planarization layer 275 may cover the wiring pattern 215, the connection pattern 235, and the connection electrode 330, and may be disposed to have a substantially uniform thickness along a profile of the wiring pattern 215, the connection pattern 235, and the connection electrode 330. The second planarization layer 275 may include organic materials and/or inorganic materials. In example embodiments, the second planarization layer 275 may include organic materials.

The lower electrode 290 may be disposed in the light emitting region 30 on the second planarization layer 275. The lower electrode 290 may be in contact with the connection pattern 235 via a contact hole formed by removing a portion of the second planarization layer 275. In some embodiments, the lower electrode 290 may be electrically connected to the semiconductor element 250. The lower electrode 290 may include a metal, a metal alloy, metal nitride, conductive metal oxide, transparent conductive materials, and/or the like. These may be used alone or in a suitable combination thereof. In some example embodiments, the lower electrode 290 may have a multi-layered structure including a plurality of layers.

The pixel defining layer 310 may be disposed in the light emitting region 30 on the second planarization layer 275, and may expose a portion of the lower electrode 290. For example, the pixel defining layer 310 may extend in the first direction D1, may cover both lateral portions of the lower electrode 290, and may be disposed in the peripheral region 40, the bending region 50, and the pad region 60. In some embodiments, the pixel defining layer 310 may be disposed only in the light emitting region 30, and might not be disposed in the peripheral region 40, the bending region 50, or the pad region 60. The pixel defining layer 310 may include organic materials and/or inorganic materials. In example embodiments, the pixel defining layer 310 may include organic materials.

The light emitting layer 335 may be disposed on a portion of the lower electrode 290 exposed by the pixel defining layer 310. The light emitting layer 335 may be formed using at least one of suitable light emitting materials capable of generating different colors of light (e.g., a red color of light, a blue color of light, and/or a green color of light, and/or the like) according to sub-pixels. In some embodiments, the light emitting layer 335 may generate a white color of light by stacking a plurality of light emitting materials capable of generating different colors of light such as a red color of light, a green color of light, a blue color of light, and/or the like. In this case, a color filter may be disposed on the light emitting layer 335. The color filter may include at least one selected from a red color filter, a green color filter, and a blue color filter. In some embodiments, the color filter may include a yellow color filter, a cyan color filter, and/or a magenta color filter. The color filter may include a photosensitive resin, a color photoresist, and/or the like.

The upper electrode 340 may be disposed in the light emitting region 30 on the pixel defining layer 310 and the light emitting layer 335. The upper electrode 340 may include a metal, a metal alloy, metal nitride, conductive metal oxide, transparent conductive materials, and/or the like. These may be used alone or in a suitable combination thereof. In some example embodiments, the upper electrode 340 may have a multi-layered structure including a plurality of layers. Accordingly, the light emitting structure 500 including the lower electrode 290, the light emitting layer 335, and the upper electrode 340 may be constituted (e.g. formed).

The first TFE layer 451 may be disposed in the light emitting region 30 on the upper electrode 340. The first TFE layer 451 may cover the upper electrode 340, and may be disposed to have a substantially uniform thickness along a profile of the upper electrode 340. The first TFE layer 451 may prevent or reduce the light emitting structure 500 from being deteriorated by the permeation of moisture, water, oxygen, and/or the like. In addition, the first TFE layer 451 may protect the light emitting structure 500 from external impacts. The first TFE layer 451 may include inorganic materials having flexibility.

The second TFE layer 452 may be disposed on the first TFE layer 451. The second TFE layer 452 may improve the flatness of the OLED device 100, and may protect the light emitting structure 500. The second TFE layer 452 may include organic materials having the flexibility.

The third TFE layer 453 may be disposed on the second TFE layer 452. The third TFE layer 453 may cover the second TFE layer 452, and may be disposed to have a substantially uniform thickness along a profile of the second TFE layer 452. The third TFE layer 453, together with the first TFE layer 451 and the second TFE layer 452, may prevent or reduce the light emitting structure 500 from being deteriorated by the permeation of moisture, water, oxygen, and/or the like. In addition, the third TFE layer 453, together with the and second TFE layers 451 and 452, may protect the light emitting structure 500 from external impacts. The third TFE layer 453 may include inorganic materials having the flexibility. Accordingly, the TFE structure 450 including the first TFE layer 451, the second TFE layer 452, and the third TFE layer 453 may be constituted (e.g., formed). In some embodiments, the display panel 200 may include the substrate 110, the buffer layer 115, the semiconductor element 250, the light emitting structure 500, the fan-out wiring 1300, the conductive pattern 460, the first planarization layer 270, the second planarization layer 275, the connection electrode 330, the wiring pattern 215, the connection pattern 235, the pixel defining layer 310, and the TFE structure 450, without limitation.

In some embodiments, the TFE structure 450 may have five layers, where first to fifth TFE layers are stacked, or seven layers, where the first to seventh TFE layers are stacked.

The first touch screen electrode 382 may be disposed on the third TFE layer 453. In example embodiments, the first touch screen electrode 382 may be disposed directly on the third TFE layer 453.

As illustrated in FIG. 5, the OLED device 100 may include a plurality of first touch screen electrodes 382 disposed on the third TFE layer 453 (e.g., one first touch screen electrode among the plurality of first touch screen electrodes 382 is illustrated in FIG. 4). The first touch screen electrodes 382 may extend in the second direction D2 (or the first direction D1) that is parallel to an upper surface of the OLED device 100, and may be spaced apart from each other in the third direction D3. A first touch sensing voltage may be applied to the first touch screen electrodes 382. For example, the first touch screen electrode 382 may include carbon nanotube (CNT), transparent conductive oxide (TCO), ITO, indium gallium zinc oxide (IGZO), ZnOx, graphene, silver nanowire (AgNW), Cu, Cr, and/or the like.

Referring again to FIGS. 4 and 5, the first organic insulation layer 392 may be disposed on the first touch screen electrodes 382. The first organic insulation layer 392 may cover the first touch screen electrodes 382 in the light emitting region 30, and may extend in the first direction D1. In example embodiments, the first organic insulation layer 392 may be disposed in the bending region 50 on the display panel 200. In some embodiments, the first organic insulation layer 392 may be continuously disposed in the display region 10, the bending region 50, and a portion of the pad region 60 on the display panel 200. For example, the first organic insulation layer 392 may sufficiently (or suitably) cover the first touch screen electrodes 382 in the light emitting region 30 on the third TFE layer 453, and may have a substantially flat upper surface, without a step around the first touch screen electrodes 382. In some embodiments, the first organic insulation layer 392 may extend in the first direction D1, and may be disposed in the peripheral region 40, the bending region 50, and a portion of the pad region 60 on the pixel defining layer 310. The first organic insulation layer 392 may include a photoresist, a polyacryl-based resin, a polyimide-based resin, a polyamide-based resin, a siloxane-based resin, an acryl-based resin, and/or an epoxy-based resin. In some embodiments, the first organic insulation layer 392 may include polyethylene terephthalate (PET), polyethylene naphthalate (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), modified polyphenylene oxide (MPPO), and/or the like. In example embodiments, the first organic insulation layer 392 may consist essentially of organic materials.

The second touch screen electrode 384 may be disposed on the first organic insulation layer 392. As illustrated in FIG. 5, the OLED device 100 may include a plurality of second touch screen electrodes 384 disposed on the first organic insulation layer 392 (e.g., one second touch screen electrode 384 among the plurality of second touch screen electrodes 384 is illustrated in FIG. 4). The second touch screen electrodes 384 may extend in the third direction D3 that is crossing (e.g., is perpendicular to) the second direction D2, and may be spaced apart from each other in the second direction D2 (or the first direction D1). Here, the first touch screen electrode 382 may cross the second touch screen electrode 384, and each of the first touch screen electrode 382 and the second touch screen electrode 384 may have a plan shape of a bar. A second touch sensing voltage may be applied to the second touch screen electrodes 384.

The OLED device 100 may electrically connect the touch screen electrode 380 and the external device 101 (refer to FIG. 2) through a touch sensor wiring, and the first and second touch sensing voltages generated from the external device 101 may be provided to the first and second touch screen electrodes 382 and 384, respectively. The external device 101 may sense (or detect) a changed capacitance between the first and second touch screen electrodes 382 and 384. For example, the first touch sensing voltage, that is a sensing input signal generated from the external device 101, may be applied to the first touch screen electrode 382, and the second touch sensing voltage, that is a sensing output signal, may be outputted (or provided) to the external device 101 through the second touch screen electrode 384. In some embodiments, the first touch sensing voltage may have a periodically varying voltage level, and the second touch sensing voltage may have a DC voltage level.

For example, when a user of the OLED device 100 contacts an upper surface of the OLED device 100 (e.g., an upper surface of the cover window 415), a capacitance of the first and second touch screen electrodes 382 and 384 corresponding to the contact surface may be changed. A change in capacitance may be generated between a portion of the body that is connected to the upper surface of the OLED device 100 and the first and second touch screen electrodes 382 and 384, and the sensing output signal changed by the changed capacitance may be output to the external device 101 through the touch sensor wiring. The external device 101 may detect the changed sensing output signal. That is, the OLED device 100 may detect a contact position of the user by using the first and second touch sensing voltages. After the user's contact of the OLED device 100 has ended, the external device 101 may provide the first and second touch sensing voltages to the first and second touch screen electrodes 382 and 384, respectively.

The second touch screen electrode 384 may include CNT, TCO, ITO, IGZO, ZnOx, graphene, AgNW, Cu, Cr, and/or the like. In some embodiments, the first touch screen electrode 382 and the second touch screen electrode 384 may be formed using the same materials. Accordingly, the touch screen electrode 380 including the first touch screen electrode 382 and the second touch screen electrode 384 may be constituted (e.g., formed).

The second organic insulation layer 394 may be disposed on the second touch screen electrode 384. The second organic insulation layer 394 may cover the second touch screen electrode 384 in the light emitting region 30, and may extend in the first direction D1. In example embodiments, the second organic insulation layer 394 may be disposed in the bending region 50 on the display panel 200. In some embodiments, the second organic insulation layer 394 may be continuously disposed in the display region 10, the bending region 50, and a portion of the pad region 60 on the display panel 200. For example, the second organic insulation layer 394 may sufficiently (or suitably) cover the second touch screen electrode 384 in the light emitting region 30 on the first organic insulation layer 392, and may have a substantially flat upper surface, without a step around the second touch screen electrode 384. In some embodiments, the second organic insulation layer 394 may extend in the first direction D1, and may be disposed in the peripheral region 40, the bending region 50, and a portion of the pad region 60 on the first organic insulation layer 392. The second organic insulation layer 394 may include a photoresist, a polyacryl-based resin, a polyimide-based resin, a polyamide-based resin, a siloxane-based resin, an acryl-based resin, and/or an epoxy-based resin. In some embodiments, the second organic insulation layer 394 may include PET, PEN, PP, PC, PS, PSul, PE, PPA, PES, PAR, PCO, MPPO, and/or the like. In example embodiments, the second organic insulation layer 394 may consist essentially of organic materials. In some embodiments, the second organic insulation layer 394 and the first organic insulation layer 392 may be formed using the same materials. Accordingly, the organic insulation structure 390 including the first organic insulation layer 392 and the second organic insulation layer 394 may be constituted (e.g., formed).

In some example embodiments, the OLED device 100 may include a touch screen electrode 1380 of FIG. 6 instead of the touch screen electrode 380 of FIG. 5. The touch screen electrode 1380 may include a first touch screen electrode 1382, a second touch screen electrode 1384, and a connection pattern 1180. As illustrated in FIG. 6, the OLED device 100 may include a plurality of first touch screen electrodes 1382 disposed on the third TFE layer 453. The first touch screen electrodes 1382 may extend in the second direction D2 (or the first direction D1) that is parallel to an upper surface of the OLED device 100, and may be spaced apart from each other in the third direction D3. The first touch screen electrode 1382 may have a plan shape of a bar. For example, the first touch screen electrode 1382 may have the plan shape of the bar including a plurality of protrusions. A first touch sensing voltage may be applied to the first touch screen electrodes 1382.

The OLED device 100 may include a plurality of second touch screen electrodes 1384 disposed on the third TFE layer 453. The second touch screen electrodes 1384 may be spaced apart from each other in the second direction D2 (or the first direction D1) between adjacent two first touch screen electrodes 1382 among the first touch screen electrodes 1382. The second touch screen electrode 1384 may be island-like. For example, the second touch screen electrode 1384 may have a plan shape of a square, and may be disposed between the protrusions of the first touch screen electrode 1382. In example embodiments, the first touch screen electrode 1382 and the second touch screen electrode 1384 may be located at the same layer (e.g., the same layer level).

The first organic insulation layer 392 may be disposed on the first touch screen electrodes 1382 and the second touch screen electrode 1384. The first organic insulation layer 392 may cover the first touch screen electrodes 1382 and the second touch screen electrode 1384 in the light emitting region 30, and may extend in the first direction D1. In example embodiments, the first organic insulation layer 392 may be disposed in the bending region 50 on the display panel 200. In some embodiments, the first organic insulation layer 392 may be continuously disposed in the display region 10, the bending region 50, and a portion of the pad region 60 on the display panel 200. For example, the first organic insulation layer 392 may sufficiently (or suitably) cover the first touch screen electrodes 1382 and the second touch screen electrode 1384 in the light emitting region 30 on the third TFE layer 453, and may have a substantially flat upper surface, without a step around the first touch screen electrodes 382 and the second touch screen electrode 1384. In some embodiments, the first organic insulation layer 392 may extend in the first direction D1, and may be disposed in the peripheral region 40, the bending region 50, and a portion of the pad region 60 on the pixel defining layer 310.

Further, the OLED device 100 may include a plurality of connection patterns 1180 disposed on the first touch screen electrode 1382 and the second touch screen electrode 1384. In some embodiments, the connection pattern 1180 may be disposed under the first touch screen electrode 1382 and the second touch screen electrode 1384. The connection pattern 1180 may be in contact with (e.g., electrically connected to) two second touch screen electrodes 1384 adjacent to each other in the third direction D3 from among the plurality of second touch screen electrodes 1384. In example embodiments, the connection pattern 1180 may be located in a different layer (e.g., different layer level) from that of the first touch screen electrode 1382 and the second touch screen electrode 1384. For example, the connection pattern 1180 may be disposed on or under the first touch screen electrode 1382 and the second touch screen electrode 1384.

The OLED device 100 may electrically connect the touch screen electrode 1380 and the external device 101 through a touch sensor wiring, and the first and second touch sensing voltages generated from the external device 101 may be provided to the first and second touch screen electrodes 1382 and 1384, respectively. The external device 101 may detect a change in capacitance between the first and second touch screen electrodes 1382 and 1384. For example, the first touch sensing voltage, that is a sensing input signal, generated from the external device 101 may be applied to the first touch screen electrode 1382, and the second touch sensing voltage, that is a sensing output signal, may be outputted to the external device 101 through the second touch screen electrode 1384. Here, the first touch sensing voltage may have a periodically varying voltage level, and the second touch sensing voltage may have a DC voltage level.

For example, when a user of the OLED device 100 contacts an upper surface of the OLED device 100, a capacitance of the first and second touch screen electrodes 1382 and 1384 corresponding to the contact surface may be changed. A changed capacitance may be generated between a portion of the body that is connected to the upper surface of the OLED device 100 and the first and second touch screen electrodes 1382 and 1384, and the sensing output signal changed by the changed capacitance may be output to the external device 101 through the touch sensor wiring. The external device 101 may detect the changed sensing output signal. That is, the OLED device 100 may detect a contact position of the user by using the first and second touch sensing voltages. After the user's contact of the OLED device 100 has ended, the external device 101 may provide the first and second touch sensing voltages to the first and second touch screen electrodes 1382 and 1384, respectively. Accordingly, the touch screen electrode 1380 including the first touch screen electrode 1382 and the second touch screen electrode 1384 may be constituted (e.g., formed).

The second organic insulation layer 394 may be disposed on the connection pattern 1180. The second organic insulation layer 394 may cover the connection pattern 1180 in the light emitting region 30, and may extend in the first direction D1. In example embodiments, the second organic insulation layer 394 may be disposed in the bending region 50 on the display panel 200. In some embodiments, the second organic insulation layer 394 may be continuously disposed in the display region 10, the bending region 50, and a portion of the pad region 60 on the display panel 200. For example, the second organic insulation layer 394 may sufficiently (or suitably) cover the connection pattern 1180 in the light emitting region 30 on the first organic insulation layer 392, and may have a substantially flat upper surface, without a step around the connection pattern 1180. In some embodiments, the second organic insulation layer 394 may extend in the first direction D1, and may be disposed in the peripheral region 40, the bending region 50, and a portion of the pad region 60 on the first organic insulation layer 392. Accordingly, the organic insulation structure 390 including the first organic insulation layer 392 and the second organic insulation layer 394 may be constituted (e.g., formed).

Referring again to FIG. 4, the polarizing layer 430 may be disposed on the touch screen 400. The polarizing layer 430 may overlap the light emitting region 30 and a portion of the peripheral region 40 on the substrate 110. The polarizing layer 430 may include a linearly polarized film and a $\lambda/4$ phase retardation film. The $\lambda/4$ phase retardation film may be disposed on the touch screen 400. The $\lambda/4$ phase retardation film may convert a phase of a light. For example, the $\lambda/4$ phase retardation film may convert the light vibrating up and down or the light vibrating left and right into right-circularly polarized light or left-circularly polarized light, respectively. In some embodiments, the λ/4 phase retardation film may convert the right-circularly polarized light or the left-circularly polarized light into the light vibrating up and down or the light vibrating left and right, respectively. The λ/4 phase retardation film may include a birefringent film containing polymer, an orientation film of a liquid crystal polymer, alignment layer of a liquid crystal polymer, and/or the like.

The linearly polarized film may be disposed on the λ/4 phase retardation film.

The linearly polarized film may selectively transmit an incident light. For example, the linearly polarized film may transmit the light vibrating up and down or vibrating left and right. In this case, the linearly polarized film may include a pattern of horizontal stripes or vertical stripes. When the linearly polarized film includes a pattern of horizontal stripes, the linearly polarized film may block the light vibrating up and down, and may transmit the light vibrating left and right. When the linearly polarized film includes a pattern of vertical stripes, the linearly polarized film may block the light vibrating left and right, and may transmit the light vibrating up and down. The light transmitted by the linearly polarized film may then be transmitted by the λ/4 phase retardation film. As described above, the λ/4 phase retardation film may convert a phase of the light. For example, when the incident light vibrating up, down, left, and right passes through the linearly polarized film, the linearly polarized film including a pattern of the horizontal stripes may transmit the light vibrating left and right. When the incident transmitted light vibrating left and right then passes through the λ/4 phase retardation film, the incident light vibrating left and right may be converted into the left-circularly polarized light. The incident light including the left-circularly polarized light may be reflected at the upper electrode 340, and then the incident light may be converted into the right-circularly polarized light. When the incident light including the right-circularly polarized light then passes through the λ/4 phase retardation film, the incident light may be converted into the light vibrating up and down. Here, the light vibrating up and down may be blocked by the linearly polarized film including a pattern of the horizontal stripes. Accordingly, the incident light may be removed by the linearly polarized film and the λ/4 phase retardation film (i.e., the polarizing layer 430). For example, the linearly polarized film may include iodine-based materials, materials containing dye, polyene-based materials, and/or the like. In example embodiments, a thickness of the polarizing layer 430 may be about 31 micrometers. In some embodiments, the polarizing layer 430 may be a thin film polarizing layer.

The cover window 415 may be disposed on the polarizing layer 430. The cover window 415 may overlap the display region 10 and a portion of the bending region 50 on the substrate 110. The cover window 415 may protect the polarizing layer 430 and the display panel 200. The cover window 415 may include materials having heat resistance and/or transparency. For example, the cover window 415 may include a transparent plastic having transparency of above about 95% and/or a glass. In some embodiments, the cover window 415 may have a multi-layered structure including a plurality of layers.

For example, a comparable OLED device may include a polarizing layer where a thickness is about 132 micrometers (e.g., the polarizing layer having a relatively large thickness) and a bending protection layer where a thickness is about 100 micrometers. The polarizing layer may be disposed in a display region on the display panel, and the bending protection layer may be disposed in a portion of a peripheral region, a bending region, and a portion of a pad region on the display panel. Here, the polarizing layer may be in direct contact with the bending protection layer in the peripheral region, and the bending protection layer may have a relatively large thickness in a direction vertical to the first, second, and third directions D1, D2, and D3 (e.g., in the present FIG. 4, a direction extending from the substrate 110 to the cover window 415), at a contact portion where the polarizing layer is in direct contact with the bending protection layer. For example, the bending protection layer may have a protrusion in the peripheral region. A thickness of the bending protection layer may be determined (or set) such that a neutral plane is located at (or located above) a portion where the connection electrodes are disposed in the bending region. As such, when the bending region is bent, the connection electrodes might not be broken because the neutral plane of the bending region is located at the portion where the connection electrodes are disposed in the bending region.

However, in order to manufacture such comparable OLED device to be relatively thin, a thickness of the polarizing layer may be thinly manufactured. For example, the comparable OLED device may include the polarizing layer having a thickness of about 31 micrometers (e.g., the polarizing layer having a relatively thin thickness) and the bending protection layer having a thickness of about 100 micrometers. In this case, however, an adhesion failure of a cover window disposed on the polarizing layer having the relatively thin thickness may occur due to the protrusion of the bending protection layer. In addition, to avoid the bending protection layer being separated from a display panel, when the bending protection layer of the comparable OLED device is bent, the bending protection layer may be disposed to overlap a peripheral region and a pad region. Accordingly, a length of the peripheral region of the comparable OLED device may be increased to secure a process margin of the bending protection layer, and thus a dead space (e.g., a non-display region) of the comparable OLED device may be relatively increased.

In example embodiments of the present disclosure, the organic insulation structure 390 may be utilized instead of the bending protection layer and may be disposed in the bending region 50. For example, the organic insulation structure 390 may be disposed in the bending region 50 such that a neutral plane in the bending region 50 is located at a portion where the connection electrode 330 is disposed. Here, a thickness of the organic insulation structure 390 may be determined such that the neutral plane in the bending region 50 is located at a portion where the connection electrode 330 is disposed. In this case, since the organic insulation structure 390 consists essentially of organic materials, an inorganic insulation layer might not be disposed in the bending region 50. In addition, since the bending protection layer is not disposed in the OLED of the present embodiments, an adhesion failure of the cover window 415 might not occur. Further, as a length of the peripheral region 40 of the OLED 100 (e.g., as shown in FIG. 4) is relatively reduced, a dead space (e.g., a non-display region) of the OLED device 100 may be relatively decreased.

The first lower protection film pattern 351 and the second lower protection film pattern 352 may be disposed on the substrate 110 (e.g., on a lower surface of the substrate 110, opposite from the surface on which the buffer layer 115 may be positioned). The first lower protection film pattern 351 may be disposed in the entire display region 10, and the second lower protection film pattern 352 may be disposed in the pad region 60, and a lower surface of the display panel 200 (e.g., the lower surface of the substrate 110) located in the bending region 50 may be exposed. In some embodiments, the lower protection film 300 may expose the lower surface of the display panel 200 in the bending region 50, and the first lower protection film pattern 351 and the second lower protection film pattern 352 may be spaced apart from each other. The lower protection film 300 may protect the display panel 200 from an external impact. The lower protection film 300 may include PET, PEN, PP, PC, PS, PSul, PE, PPA, PES, PAR, PCO, MPPO, and/or the like. A thickness of the lower protection film 300 may be about 50 micrometers.

The OLED device 100 in accordance with example embodiments includes the organic insulation structure 390 included in the touch screen 400, and the organic insulation structure 390 may be utilized instead of a bending protection layer of a comparable OLED device and may be disposed in the bending region 50. For example, the organic insulation structure 390 may be disposed in the bending region 50 such that a neutral plane in the bending region 50 is located at (or located above) a portion where the connection electrode 330 is disposed. Accordingly, although the bending region 50 is bent, a cut (or breakage) of the connection electrode 330 might not occur in the bending region 50. In addition, since the bending protection layer of a comparable OLED device is not disposed (is not formed), an adhesion failure of a cover window 415 might not occur. A dead space (e.g., a non-display region) of the OLED device 100 may be relatively decreased, because a length of the peripheral region 40 (as shown in FIG. 4, for example) may be relatively reduced. Further, since the bending protection layer is not disposed, a manufacturing cost of the OLED device 100 may be relatively reduced.

Figure 7:
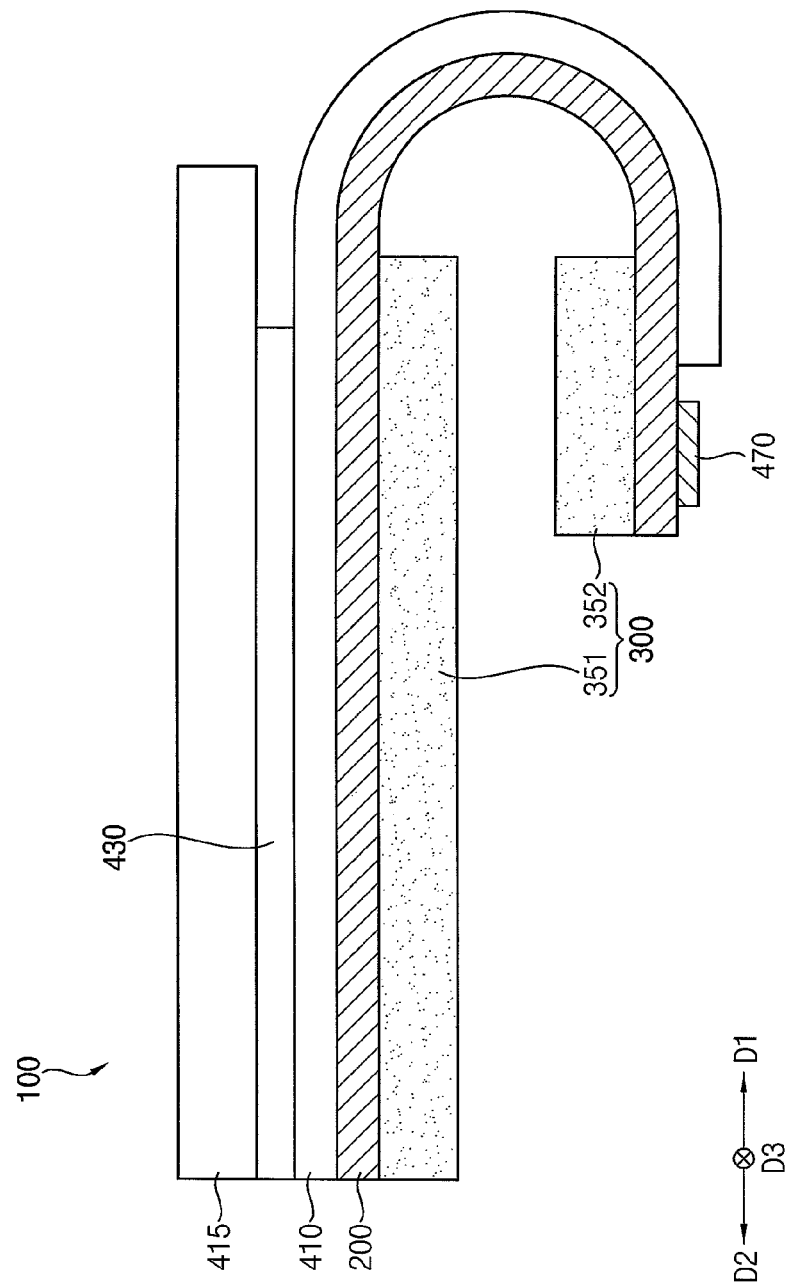
FIG. 7 is a cross-sectional view for describing a bent shape of the OLED device of FIG. 1.

FIG. 7 is a cross-sectional view for describing a bent shape of the OLED device of FIG. 1.

Referring to FIG. 7, as the bending region 50 may be bent on an axis with respect to the third direction D3 (e.g., a major axis direction of the bending region 50 of FIG. 1), such that the second lower protection film pattern 352 may be located to face a lower surface of the first lower protection film pattern 351. In some embodiments, the OLED device 100 may further include an adhesion layer interposed between the first lower protection film pattern 351 and the second lower protection film pattern 352. In this case, the first lower protection film pattern 351 and the second lower protection film pattern 352 may be fixed by the adhesion layer.

Figure 8:
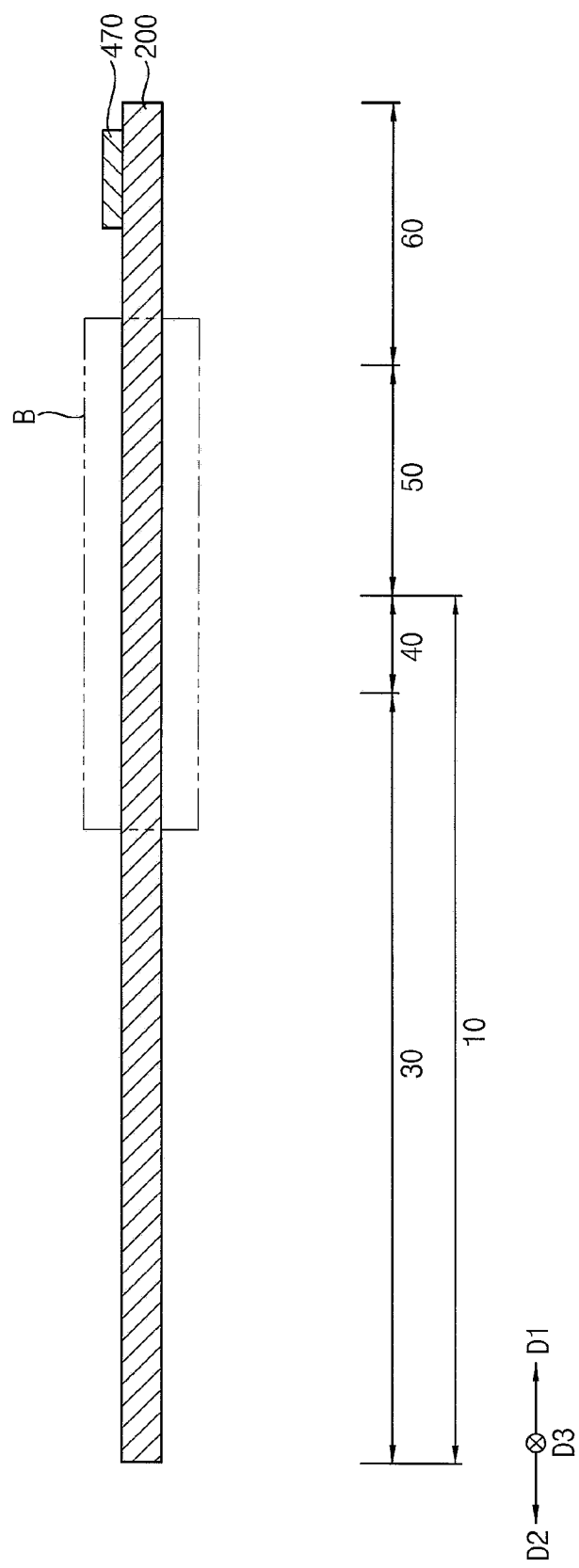
FIGS. 8 through 12 are cross-sectional views illustrating acts of a method of manufacturing an OLED device in accordance with example embodiments.
Figure 9:
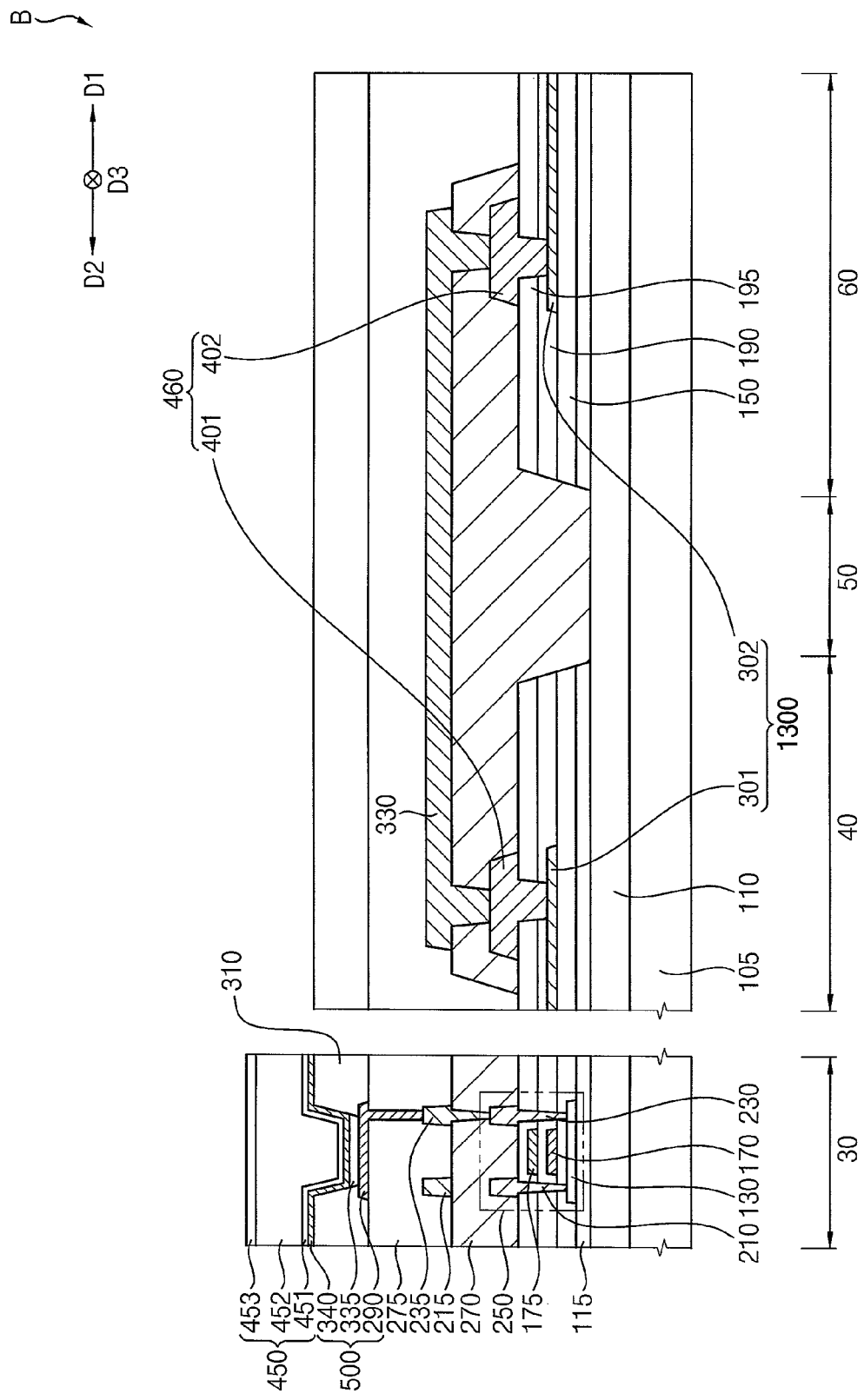
Figure 10:
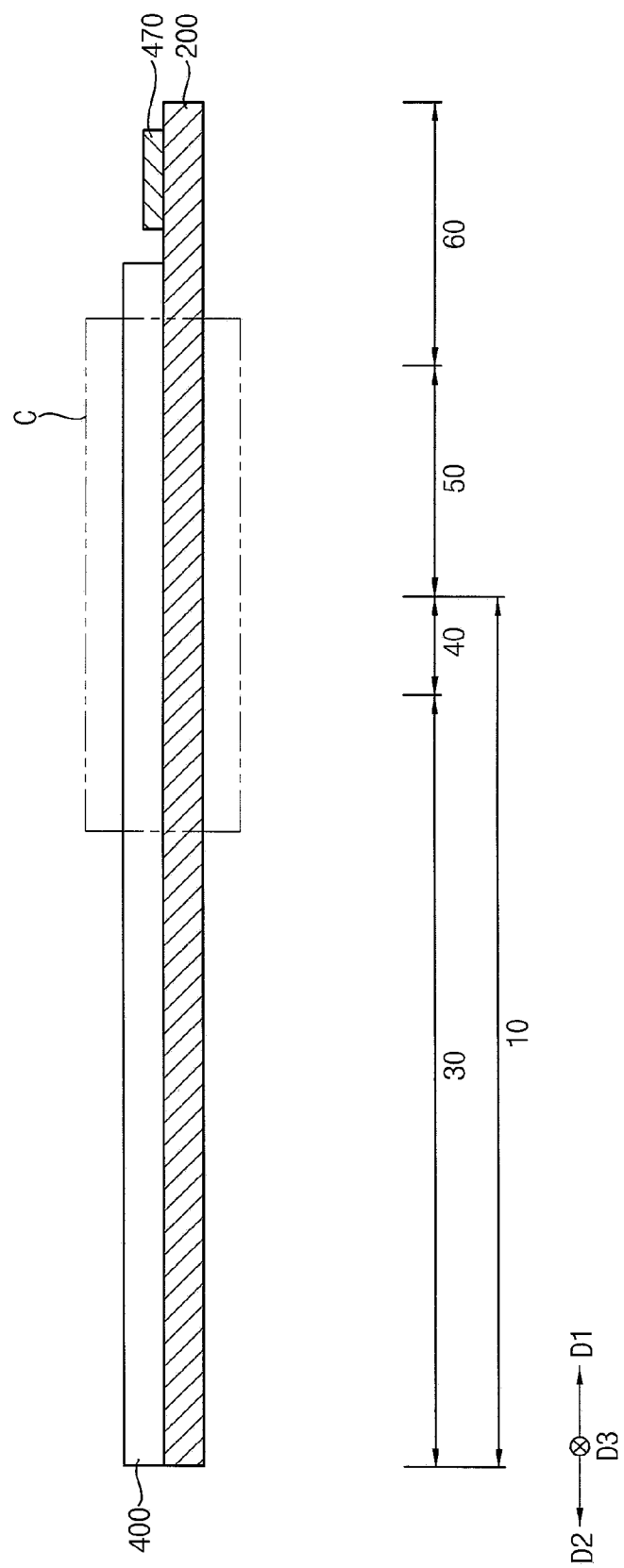
Figure 11:
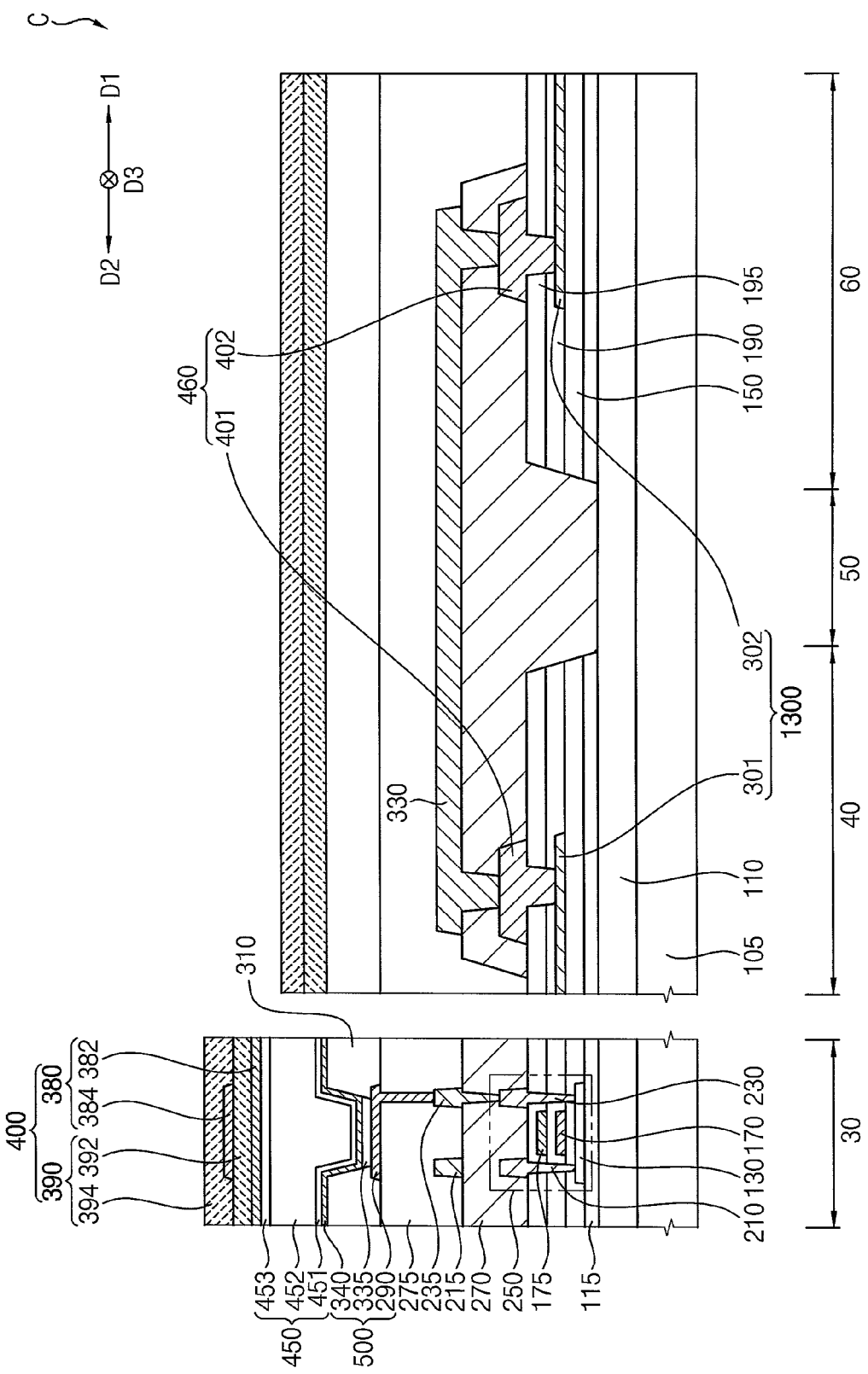

FIGS. 8 through 12 are cross-sectional views illustrating acts of a method of manufacturing an OLED device in accordance with example embodiments. FIG. 9 is an enlarged cross-sectional view corresponding to region 'B' of FIG. 8, and FIG. 11 is an enlarged cross-sectional view corresponding to region 'C' of FIG. 10.

Referring to FIG. 8, a display panel 200 may be provided. For example, as illustrated in FIG. 9, a substrate 110 may be formed on a rigid glass substrate 105. The substrate 110 may be formed using a flexible transparent resin substrate.

A buffer layer 115 may be formed on the substrate 110. In example embodiments, the buffer layer 115 may be entirely formed in (e.g., to entirely cover) a light emitting region 30, a peripheral region 40, and a pad region 60 on the substrate 110, and may have a first opening exposing a portion of an upper surface of the substrate 110 that is located in the bending region 50. The buffer layer 115 may be formed using silicon compound, metal oxide, and/or the like. For example, the buffer layer 115 may include SiOx, SiNx, SiOxNy, SiOxCy, SiCxNy, AlOx, AlNx, TaOx, HfOx, ZrOx, TiOx, and/or the like.

An active layer 130 may be formed in the light emitting region 30 on the buffer layer 115. The active layer 130 may be formed using an oxide semiconductor, an inorganic semiconductor, an organic semiconductor, and/or the like.

A gate insulation layer 150 may be formed on the active layer 130. The gate insulation layer 150 may cover the active layer 130 in the light emitting region 30 on the buffer layer 115, and may extend in a first direction D1 from the light emitting region 30 into the pad region 60. In example embodiments, the gate insulation layer 150 may be formed in the light emitting region 30, the peripheral region 40, and the pad region 60 on the buffer layer 115, and may have a second opening exposing the portion of the upper surface of the substrate 110 that is located in the bending region 50. The gate insulation layer 150 may be formed using silicon compound, metal oxide, and/or the like.

A first gate electrode 170 may be formed in the light emitting region 30 on the gate insulation layer 150. The first gate electrode 170 may be formed on a portion of the gate insulation layer 150 under which the active layer 130 is located. The first gate electrode 170 may be formed using a metal, a metal alloy, metal nitride, conductive metal oxide, transparent conductive materials, and/or the like. For example, the first gate electrode 170 may include Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, and/or the like. These may be used alone or in a suitable combination thereof. In some example embodiments, the first gate electrode 170 may have a multi-layered structure including a plurality of layers.

A first fan-out wiring 301 may extend along a second direction D2 in the peripheral region 40 on the gate insulation layer 150, and may be electrically connected to a light emitting structure formed in the light emitting region 30. In addition, a second fan-out wiring 302 may extend along the first direction D1 in the pad region 60 on the gate insulation layer 150, and may be electrically connected to an external device 101 through pad electrodes formed in the pad region 60 (refer to FIGS. 1 and 2, for example). The first fan-out wiring 301 and the second fan-out wiring 302 may each independently be formed using a metal, a metal alloy, metal nitride, conductive metal oxide, transparent conductive materials, and/or the like. These may be used alone or in a suitable combination thereof. Accordingly, a fan-out wiring 1300 including the first fan-out wiring 301 and the second fan-out wiring 302 may be formed. In example embodiments, the fan-out wiring 1300 and the first gate electrode 170 may be located at the same layer (e.g., at the same layer level), and may be simultaneously (or concurrently) formed using the same materials. In some embodiments, the fan-out wiring 1300 and a second gate electrode (which will be described herein below) may be located at the same layer (e.g., at the same level). In some example embodiments, the fan-out wiring 1300 may have a multi-layered structure including a plurality of layers.

A first insulating interlayer 190 may be formed on the first gate electrode 170. The first insulating interlayer 190 may cover the first gate electrode 170 in the light emitting region 30 on the gate insulation layer 150, and may extend in the first direction D1. In some embodiments, the first insulating interlayer 190 may cover the first fan-out wiring 301 in the peripheral region 40 and the second fan-out wiring 302 in the pad region 60 on the gate insulation layer 150. In example embodiments, the first insulating interlayer 190 may be formed in the light emitting region 30, the peripheral region 40, and the pad region 60 on the gate insulation layer 150, and may have a third opening exposing the portion of the upper surface of the substrate 110 that is located in the bending region 50. The first insulating interlayer 190 may be formed using silicon compound, metal oxide, and/or the like.

A second gate electrode 175 may be formed in the light emitting region 30 on the first insulating interlayer 190. The second gate electrode 175 may be formed on a portion of the first insulating interlayer 190 under which the first gate electrode 170 is located. The second gate electrode 175 may be formed using a metal, a metal alloy, metal nitride, conductive metal oxide, transparent conductive materials, and/or the like. These may be used alone or in a suitable combination thereof. In some example embodiments, the second gate electrode 175 may have a multi-layered structure including a plurality of layers.

A second insulating interlayer 195 may be formed on the second gate electrode 175. The second insulating interlayer 195 may cover the second gate electrode 175 in the light emitting region 30 on the first insulating interlayer 190, and may extend in the first direction D1. In example embodiments, the second insulating interlayer 195 may be formed in the light emitting region 30, the peripheral region 40, and the pad region 60 on the first insulating interlayer 190, and may have a fourth opening exposing the portion of the upper surface of the substrate 110 that is located in the bending region 50. Here, the first through fourth openings may be overlapped with each other. The second insulating interlayer 195 may be formed using a silicon compound, a metal oxide, and/or the like.

A source electrode 210 and a drain electrode 230 may be formed in the light emitting region 30 on the second insulating interlayer 195. The source electrode 210 may be in direct contact with a source region of the active layer 130 via a contact hole formed by removing a portion of the gate insulation layer 150, the first insulating interlayer 190, and the second insulating interlayer 195. The drain electrode 230 may be in direct contact with a drain region of the active layer 130 via a contact hole formed by removing another portion of the gate insulation layer 150, the first insulating interlayer 190, and the second insulating interlayer 195. The source electrode 210 and the drain electrode 230 may each independently be formed using a metal, an alloy, metal nitride, conductive metal oxide, transparent conductive materials, and/or the like. These may be used alone or in a suitable combination thereof. In some example embodiments, the source and drain electrodes 210 and 230 may each independently have a multi-layered structure including a plurality of layers. Accordingly, a semiconductor element 250 including the active layer 130, the gate insulation layer 150, the first gate electrode 170, the first insulating interlayer 190, the second gate electrode 175, the second insulating interlayer 195, the source electrode 210, and the drain electrode 230 may be formed.

A first conductive pattern 401 may be formed on the second insulating interlayer 195 and may be in direct contact with the first fan-out wiring 301 via a first contact hole formed by removing a first portion of the first insulating interlayer 190 and the second insulating interlayer 195 in the peripheral region 40, and a second conductive pattern 402 may be formed on the second insulating interlayer 195 and may be in direct contact with the second fan-out wiring 302 via a second contact hole formed by removing a second portion of the first insulating interlayer 190 and the second insulating interlayer 195 in the pad region 60. Accordingly, a conductive pattern 460 including the first conductive pattern 401 and the second conductive pattern 402 may be formed. In example embodiments, the conductive pattern 460, the source electrode 210, and the drain electrode 230 may be located at the same layer (e.g., the same layer level), and may be simultaneously (or concurrently) formed using the same materials. In some embodiments, the conductive pattern 460 and the second gate electrode 175 may be located at the same layer level. The conductive pattern 460 may be formed using a metal, an alloy of a metal, metal nitride, conductive metal oxide, transparent conductive materials, and/or the like. These may be used alone or in a suitable combination thereof. In some example embodiments, the conductive pattern 460 may have a multi-layered structure including a plurality of layers.

A first planarization layer 270 may be formed on the second insulating interlayer 195, the source electrode 210, the drain electrode 230, and the conductive pattern 460. The first planarization layer 270 may cover the source and drain electrodes 210 and 230 in the light emitting region 30 on the second insulating interlayer 195, and may cover the conductive pattern 460 in the peripheral region 40 and the pad region 60 on the second insulating interlayer 195. In example embodiments, the first planarization layer 270 may be in direct contact with side walls of each of the gate insulation layer 150, the first insulating interlayer 190, and the second insulating interlayer 195 that are located adjacent to the bending region 50 (e.g., side walls of the first through fourth openings) and the portion of the upper surface of the substrate 110 that is located in the bending region 50. In some embodiments, the first planarization layer 270 may completely (e.g., entirely) cover the conductive pattern 460. For example, the first planarization layer 270 may be formed to have a high thickness. In this case, the first planarization layer 270 may have a substantially flat upper surface, and a planarization process may be further performed on the first planarization layer 270 to implement the flat upper surface of the first planarization layer 270. In example embodiments, the first planarization layer 270 may be formed using organic materials.

A wiring pattern 215 and a connection pattern 235 may be formed in the light emitting region 30 on the first planarization layer 270. The connection pattern 235 may be spaced apart from the wiring pattern 215 in the light emitting region 30 on the first planarization layer 270. The connection pattern 235 may be in contact with the drain electrode 230 via a contact hole formed by removing a portion of the first planarization layer 270 that is located in the light emitting region 30.

A connection electrode 330 may be formed in a portion of the peripheral region 40, the bending region 50, and a portion of the pad region 60 on the first planarization layer 270. The connection electrode 330 may be in direct contact with the conductive pattern 460, and may be electrically connected to the fan-out wiring 1300.

A pad electrode 470 may be formed in the pad region 60 on the substrate 110. The pad electrode 470 may be electrically connected to the connection electrode 330 through the second fan-out wiring 302 and the second conductive pattern 402. In example embodiments, the connection electrode 330, the pad electrode 470, the wiring pattern 215, and the connection pattern 235 may be located at the same layer level, and may be simultaneously (or concurrently) formed using the same materials. The connection electrode 330, the pad electrode 470, the wiring pattern 215, and the connection pattern 235 may each independently be formed using a metal, an alloy of a metal, metal nitride, conductive metal oxide, transparent conductive materials, and/or the like. These may be used alone or in a suitable combination thereof. In some example embodiments, the connection electrode 330, the pad electrode 470, the wiring pattern 215, and the connection pattern 235 may each independently have a multi-layered structure including a plurality of layers.

A second planarization layer 275 may be formed on the wiring pattern 215, the connection pattern 235, the connection electrode 330, and the first planarization layer 270. The second planarization layer 275 may cover the wiring pattern 215 and the connection pattern 235 in the light emitting region 30 on the first planarization layer 270 and extend in the first direction D1, and may cover the connection electrode 330 in the peripheral region 40, the bending region 50, and the pad region 60. In some embodiments, the second planarization layer 275 may be formed on (or over) the entire substrate 110. The second planarization layer 275 may be formed to have a high thickness to sufficiently (or suitably) cover the wiring pattern 215, the connection pattern 235, and the connection electrode 330. In some embodiments, the second planarization layer 275 may have a substantially flat upper surface, and a planarization process may be further performed on the second planarization layer 275 to implement the flat upper surface of the second planarization layer 275. In example embodiments, the second planarization layer 275 may be formed using organic materials.

A lower electrode 290 may be formed in the light emitting region 30 on the second planarization layer 275. The lower electrode 290 may be in contact with the connection pattern 235 via a contact hole formed by removing a portion of the second planarization layer 275. In some embodiments, the lower electrode 290 may be electrically connected to the semiconductor element 250. The lower electrode 290 may be formed using a metal, a metal alloy, metal nitride, conductive metal oxide, transparent conductive materials, and/or the like. These may be used alone or in a suitable combination thereof. In some example embodiments, the lower electrode 290 may have a multi-layered structure including a plurality of layers.

A pixel defining layer 310 may be formed in the light emitting region 30 on the second planarization layer 275, and may expose a portion of the lower electrode 290. In some embodiments, the pixel defining layer 310 may extend in the first direction D1, may cover both lateral portions of the lower electrode 290, and may be formed in the peripheral region 40, the bending region 50, and the pad region 60. In some embodiments, the pixel defining layer 310 may be formed only in the light emitting region 30, and might not be formed in the peripheral region 40, the bending region 50, or the pad region 60. In example embodiments, the pixel defining layer 310 may be formed using organic materials.

A light emitting layer 335 may be formed on a portion of the lower electrode 290 exposed by the pixel defining layer 310. The light emitting layer 335 may be formed using at least one of suitable light emitting materials capable of generating different colors of light (e.g., a red color of light, a blue color of light, and a green color of light, and/or the like) according to sub-pixels. In some embodiments, the light emitting layer 335 may generate a white color of light by stacking a plurality of light emitting materials capable of generating different colors of light such as a red color of light, a green color of light, a blue color of light, and/or the like.

An upper electrode 340 may be formed in the light emitting region 30 on the pixel defining layer 310 and the light emitting layer 335. The upper electrode 340 may be formed using a metal, a metal alloy, metal nitride, conductive metal oxide, transparent conductive materials, and/or the like. These may be used alone or in a suitable combination thereof. In some example embodiments, the upper electrode 340 may have a multi-layered structure including a plurality of layers. Accordingly, a light emitting structure 500 including the lower electrode 290, the light emitting layer 335, and the upper electrode 340 may be formed.

A first TFE layer 451 may be formed in the light emitting region 30 on the upper electrode 340. The first TFE layer 451 may cover the upper electrode 340, and may be formed to have a substantially uniform thickness along a profile of the upper electrode 340. The first TFE layer 451 may prevent or reduce the light emitting structure 500 from being deteriorated by the permeation of moisture, water, oxygen, and/or the like. In addition, the first TFE layer 451 may protect the light emitting structure 500 from external impacts. The first TFE layer 451 may be formed using inorganic materials having flexibility.

A second TFE layer 452 may be formed on the first TFE layer 451. The second TFE layer 452 may improve the flatness of an OLED device, and may protect the light emitting structure 500. The second TFE layer 452 may be formed using organic materials having the flexibility.

A third TFE layer 453 may be formed on the second TFE layer 452. The third TFE layer 453 may cover the second TFE layer 452, and may be formed to have a substantially uniform thickness along a profile of the second TFE layer 452. The third TFE layer 453 together with the first TFE layer 451 and the second TFE layer 452, may prevent or reduce the light emitting structure 500 from being deteriorated by the permeation of moisture, water, oxygen, and/or the like. In addition, the third TFE layer 453, together with the and second TFE layers 451 and 452, may protect the light emitting structure 500 from external impacts. The third TFE layer 453 may be formed using inorganic materials having the flexibility. In some embodiments, a TFE structure 450 may include the first TFE layer 451, the second TFE layer 452, and the third TFE layer 453, and the display panel 200 may include the substrate 110, the buffer layer 115, the semiconductor element 250, the light emitting structure 500, the fan-out wiring 1300, the conductive pattern 460, the first planarization layer 270, the second planarization layer 275, the connection electrode 330, the wiring pattern 215, the connection pattern 235, the pixel defining layer 310, and the TFE structure 450, without limitation.

Referring to FIG. 10, a touch screen 400 may be formed on the display panel 200. As illustrated in FIG. 11, a first touch screen electrode 382 may be formed on the third TFE layer 453. In example embodiments, the first touch screen electrode 382 may be formed directly on the third TFE layer 453. The first touch screen electrode 382 may be formed using CNT, TCO, ITO, IGZO, ZnOx, graphene, AgNW, Cu, Cr, and/or the like.

A first organic insulation layer 392 may be formed on the first touch screen electrodes 382. The first organic insulation layer 392 may cover the first touch screen electrodes 382 in the light emitting region 30, and may extend in the first direction D1. In example embodiments, the first organic insulation layer 392 may be formed in the bending region 50 on the display panel 200. In some embodiments, the first organic insulation layer 392 may be continuously disposed in the display region 10, the bending region 50, and a portion of the pad region 60 on the display panel 200. For example, the first organic insulation layer 392 may sufficiently cover the first touch screen electrodes 382 in the light emitting region 30 on the third TFE layer 453, and may have a substantially flat upper surface without a step around the first touch screen electrodes 382. In addition, the first organic insulation layer 392 may extend in the first direction D1, and may be formed in the peripheral region 40, the bending region 50, and a portion of the pad region 60 on the pixel defining layer 310. The first organic insulation layer 392 may be formed using a photoresist, a polyacryl-based resin, a polyimide-based resin, a polyamide-based resin, a siloxane-based resin, an acryl-based resin, and/or an epoxy-based resin, without limitation. In some embodiments, the first organic insulation layer 392 may be formed using PET, PEN, PP, PC, PS, PSul, PE, PPA, PES, PAR, PCO, MPPO, and/or the like.

A second touch screen electrode 384 may be formed on the first organic insulation layer 392. The second touch screen electrode 384 and the first touch screen electrode 382 may be formed using the same materials. Accordingly, a touch screen electrode 380 including the first touch screen electrode 382 and the second touch screen electrode 384 may be formed.

A second organic insulation layer 394 may be formed on the second touch screen electrode 384. The second organic insulation layer 394 may cover the second touch screen electrode 384 in the light emitting region 30, and may extend in the first direction D1. In example embodiments, the second organic insulation layer 394 may be formed in the bending region 50 on the display panel 200. In some embodiments, the second organic insulation layer 394 may be continuously formed in the display region 10, the bending region 50, and a portion of the pad region 60 on the display panel 200. For example, the second organic insulation layer 394 may sufficiently (or suitably) cover the second touch screen electrode 384 in the light emitting region 30 on the first organic insulation layer 392, and may have a substantially flat upper surface, without a step around the second touch screen electrode 384. In some embodiments, the second organic insulation layer 394 may extend in the first direction D1, and may be formed in the peripheral region 40, the bending region 50, and a portion of the pad region 60 on the first organic insulation layer 392. The second organic insulation layer 394 and the first organic insulation layer 392 may be formed using the same materials. In the present embodiments, an organic insulation structure 390 may include the first organic insulation layer 392 and the second organic insulation layer 394, and the touch screen 400 may include the touch screen electrode 380 and the organic insulation structure 390. After the touch screen 400 is formed, the rigid glass substrate 105 may be removed from the substrate 110.

Figure 12:
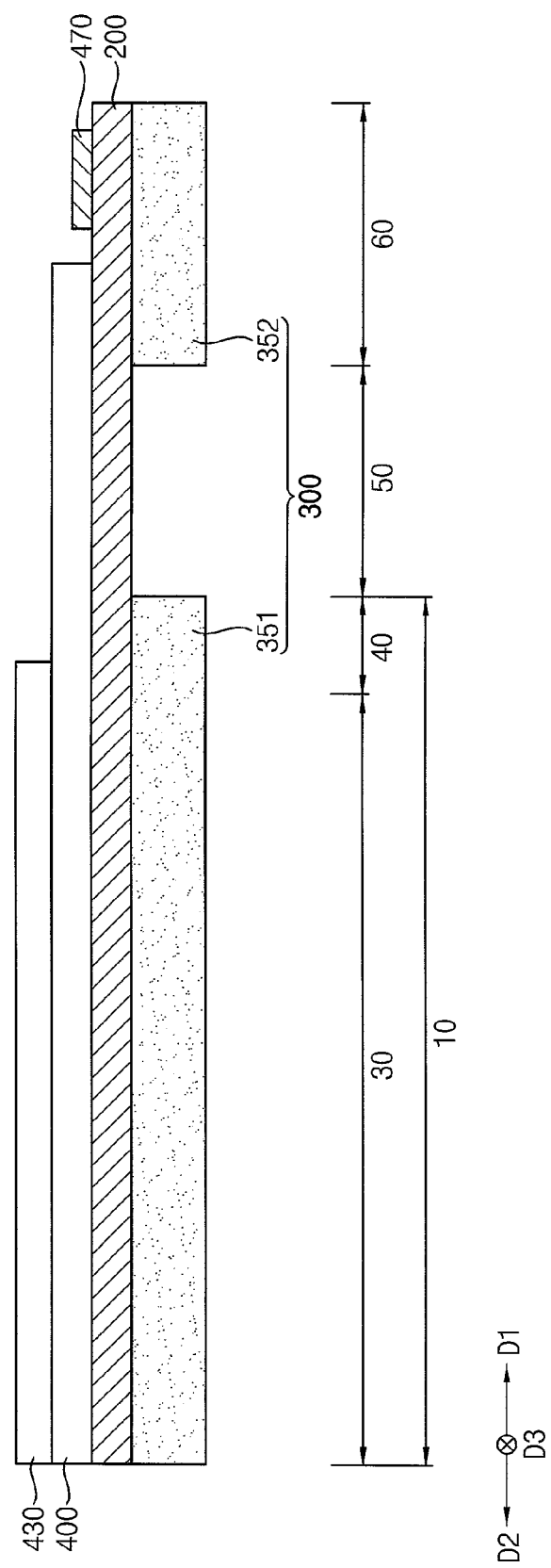

Referring to FIG. 12, a polarizing layer 430 may be formed on the touch screen 400. The polarizing layer 430 may overlap the light emitting region 30 and a portion of the peripheral region 40 on the substrate 110. The polarizing layer 430 may include a linearly polarized film and a λ/4 phase retardation film. The λ/4 phase retardation film may be formed on the touch screen 400. The λ/4 phase retardation film may be formed using a birefringent film containing polymer, an orientation film of a liquid crystal polymer, alignment layer of a liquid crystal polymer, and/or the like. The linearly polarized film may be disposed on the λ/4 phase retardation film. The linearly polarized film may be formed using iodine-based materials, materials containing dye, polyene-based materials, and/or the like. In example embodiments, a thickness of the polarizing layer 430 may be about 31 micrometers. In some embodiments, the polarizing layer 430 may be a thin film polarizing layer.

A first lower protection film pattern 351 and a second lower protection film pattern 352 may be formed on the substrate 110 (e.g., on a lower surface on the substrate 110). The first lower protection film pattern 351 may be formed in the entire display region 10, and the second lower protection film pattern 352 may be formed in the pad region 60, such that a lower surface of the display panel 200 (e.g., the lower surface of the substrate 110) located in the bending region 50 may be exposed. Accordingly, a lower protection film 300 including the first lower protection film pattern 351 and the second lower protection film pattern 352 may be formed. The lower protection film 300 may protect the display panel 200 from an external impact. The lower protection film 300 may be formed using PET, PEN, PP, PC, PS, PSul, PE, PPA, PES, PAR, PCO, MPPO, and/or the like. A thickness of the lower protection film 300 may be about 50 micrometers.

A cover window 415 may be formed on the polarizing layer 430. The cover window 415 may overlap the display region 10 and a portion of the bending region 50 on the substrate 110. The cover window 415 may protect the polarizing layer 430 and the display panel 200. The cover window 415 may be formed using materials having heat resistance and/or transparency. For example, the cover window 415 may include a transparent plastic having transparency of above about 95% and/or a glass. In some embodiments, the cover window 415 may have a multi-layered structure including a plurality of layers. According to the method described herein, the OLED device 100 (as illustrated in FIG. 3, for example) may be manufactured, and the OLED device 100 may serve as a flexible OLED device capable of bending (or being bent) in the bending region 50.

Figure 13:
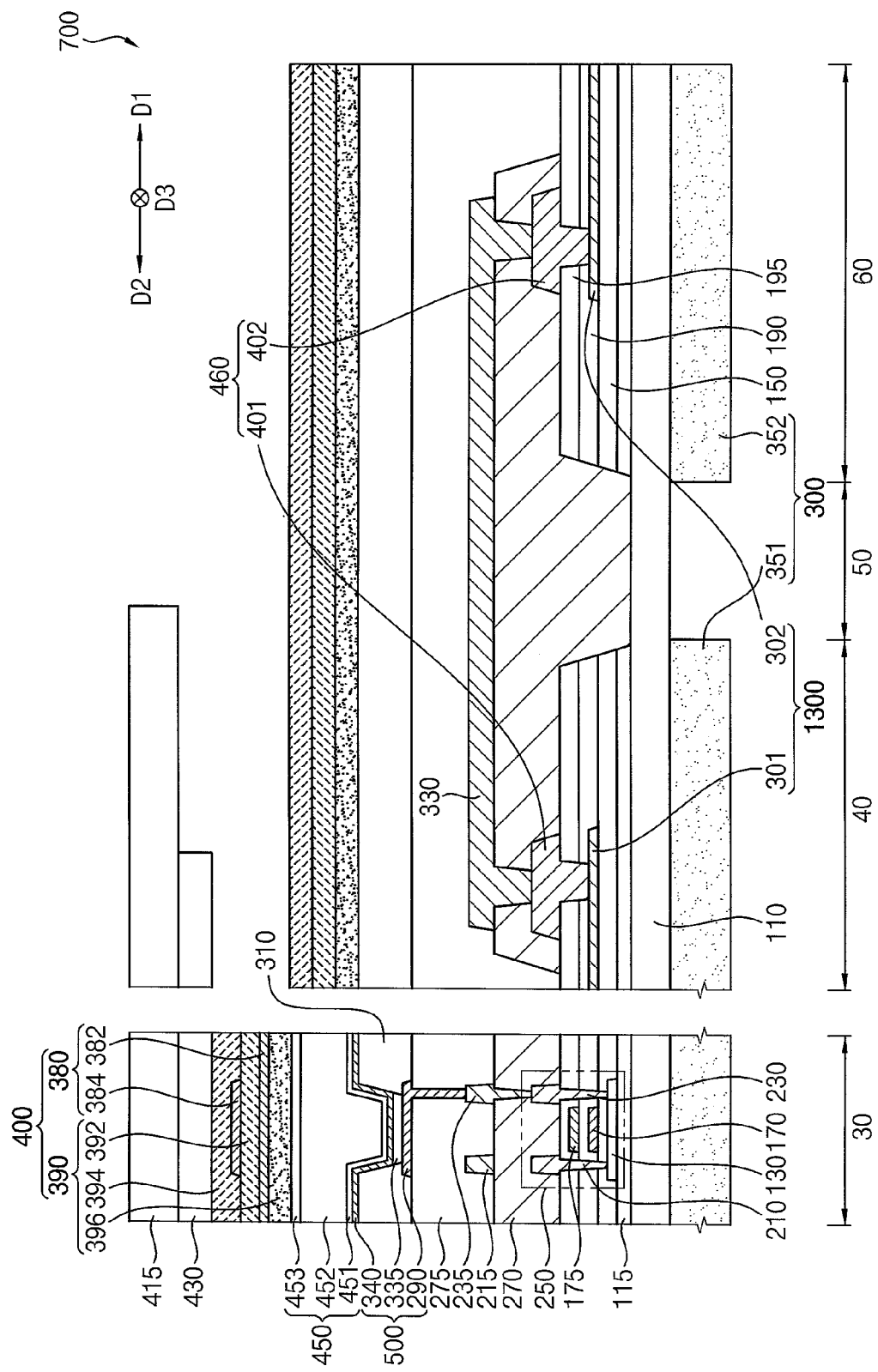
FIG. 13 is a cross sectional view illustrating an OLED device in accordance with example embodiments.

FIG. 13 is a cross sectional view illustrating an OLED device in accordance with one or more example embodiments. An OLED device 700 illustrated in FIG. 13 may have a configuration that is substantially the same as or similar to that of the OLED device 100 described with reference to FIGS. 1 through 7, except for including a third organic insulation layer 396. In FIG. 13, duplicative descriptions of the elements that are substantially the same as or similar to the elements described with reference to FIGS. 1 through 7 will not be provided.

Referring to FIG. 13, the OLED device 700 may include a display panel 200, a touch screen 400, a polarizing layer 430, a cover window 415, a lower protection film 300, etc. Here, the display panel 200 may include a substrate 110, a buffer layer 115, a semiconductor element 250, a light emitting structure 500, a fan-out wiring 1300, a conductive pattern 460, a first planarization layer 270, a second planarization layer 275, a connection electrode 330, a wiring pattern 215, a connection pattern 235, a pixel defining layer 310, and a TFE structure 450, without limitation, and the TFE structure 450 may include a first TFE layer 451, a second TFE layer 452, and a third TFE layer 453. In example embodiments, the touch screen 400 may include a touch screen electrode 380 and an organic insulation structure 390. The touch screen electrode 380 may include a first touch screen electrode 382 and a second touch screen electrode 384, and the organic insulation structure 390 may include a first organic insulation layer 392, a second organic insulation layer 394, and a third organic insulation layer 396. For example, the touch screen electrode 380 of FIG. 13 may correspond to the touch screen electrode 380 (including a first touch screen electrode 382 and a second touch screen electrode 384) illustrated in FIG. 5. In some embodiments, the touch screen electrode 380 of FIG. 13 may correspond to the touch screen electrode 1380 (including a first touch screen electrode 1382, a second touch screen electrode 1384, and a connection pattern 1180) illustrated in FIG. 6.

The third organic insulation layer 396 may be disposed on the third TFE layer 453. In some embodiments, the third organic insulation layer 396 may be disposed under the first touch screen electrode 382 and the first organic insulation layer 392. The third organic insulation layer 396 may cover the third TFE layer 453 in the light emitting region 30, and may extend in the first direction D1. In example embodiments, the third organic insulation layer 396 may be disposed in the bending region 50 on the display panel 200. In some embodiments, the third organic insulation layer 396 may be continuously disposed in the display region 10, the bending region 50, and a portion of the pad region 60 on the display panel 200. For example, the third organic insulation layer 396 may sufficiently (or suitably) cover the third TFE layer 453 in the light emitting region 30, and may have a substantially flat upper surface, without a step. The third organic insulation layer 396 may extend in the first direction D1, and may be disposed in the peripheral region 40, the bending region 50, and a portion of the pad region 60 on the pixel defining layer 310. The third organic insulation layer 396 may improve a surface flatness of the third TFE layer 453 when a surface of the third TFE layer 453 is relatively irregular. The third organic insulation layer 396 may include a photoresist, a polyacryl-based resin, a polyimide-based resin, a polyamide-based resin, a siloxane-based resin, an acryl-based resin, and/or an epoxy-based resin, without limitation. In some embodiments, the third organic insulation layer 396 may include PET, PEN, PP, PC, PS, PSul, PE, PPA, PES, PAR, PCO, MPPO, and/or the like. In example embodiments, the third organic insulation layer 396 may consist essentially of organic materials.

The OLED device 700 in accordance with example embodiments includes the organic insulation structure 390 included in the touch screen 400, where the organic insulation structure 390 may be utilized instead of a bending protection layer of a comparable OLED device and may be disposed in the bending region 50. As the organic insulation structure 390 includes the first organic insulation layer 392, the second organic insulation layer 394, and the third organic insulation layer 396, a neutral plane in the bending region 50 may be readily located at (or located above) a portion where the connection electrode 330 is disposed because a thickness of the organic insulation structure 390 is relatively increased.

Figure 14:
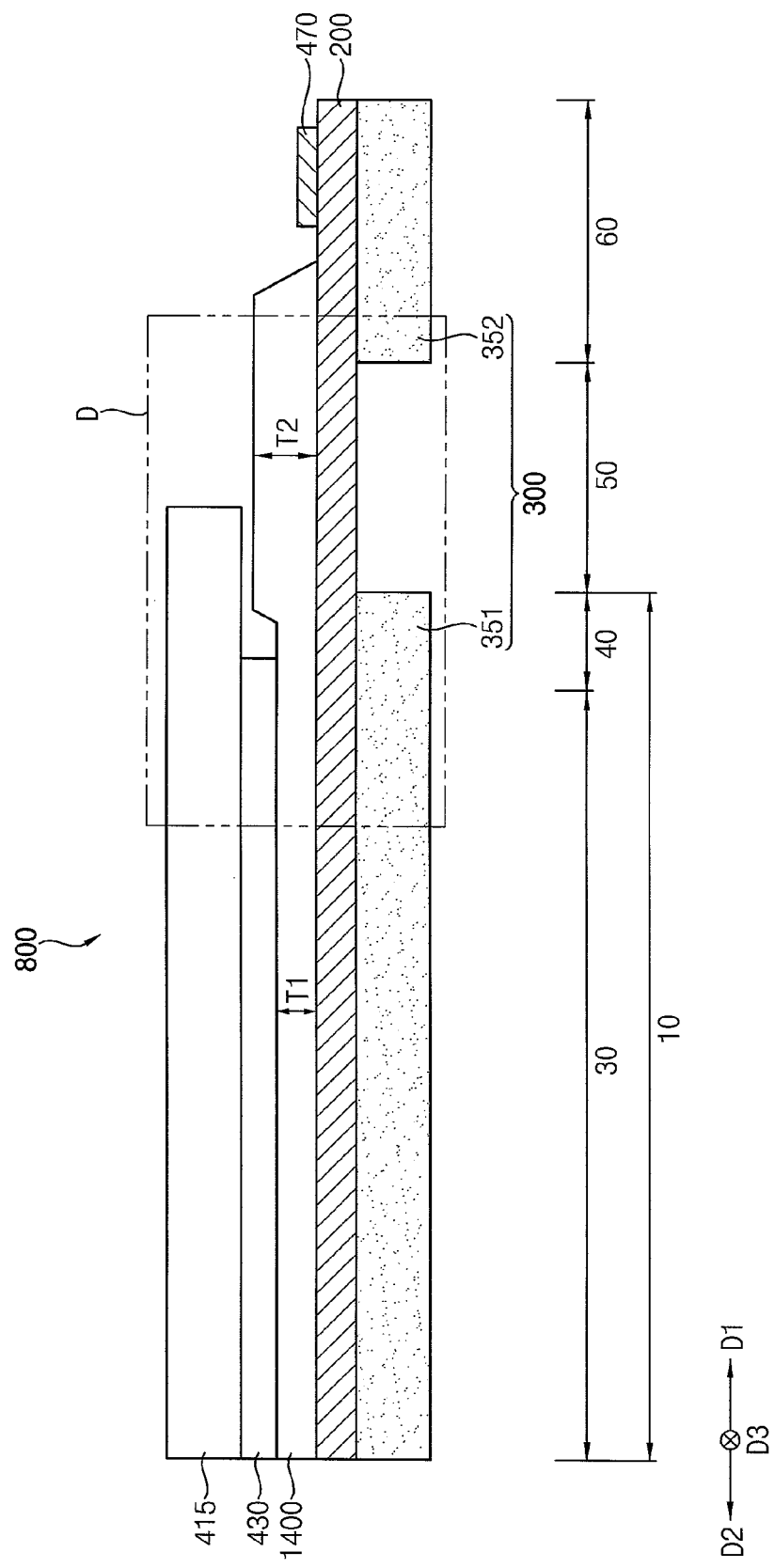
FIG. 14 is a cross sectional view illustrating an OLED device in accordance with example embodiments.
Figure 15:
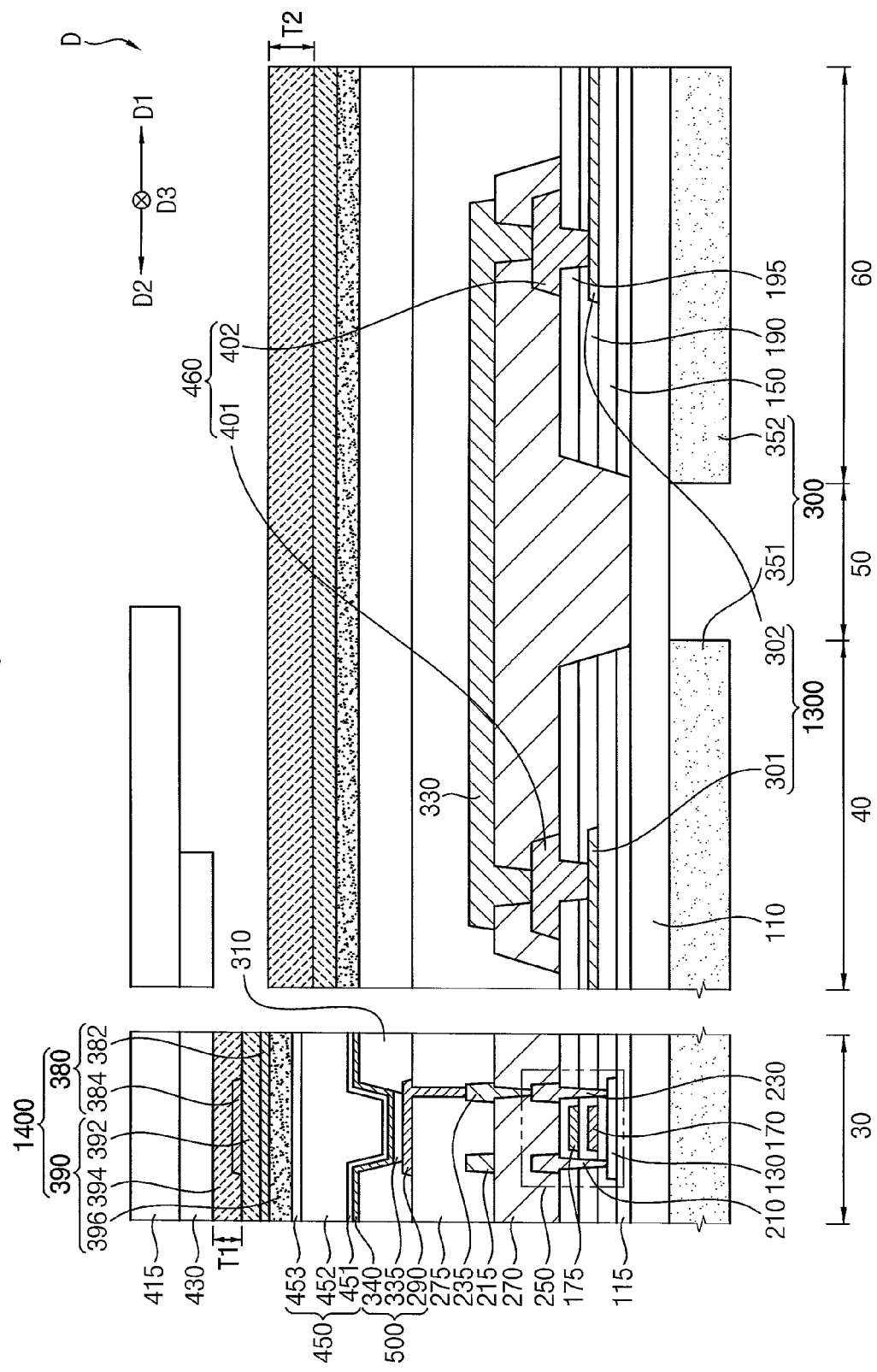
FIG. 15 is an enlarged cross-sectional view corresponding to region 'D' of FIG. 14.

FIG. 14 is a cross sectional view illustrating an OLED device in accordance with example embodiments, and FIG. 15 is an enlarged cross-sectional view corresponding to region 'D' of FIG. 14. An OLED device 800 illustrated in FIGS. 14 and 15 may have a configuration substantially the same as or similar to that of the OLED device 700 described with reference to FIG. 13, except for including a touch screen 1400. In FIGS. 14 and 15, duplicative descriptions of the elements that are substantially the same as or similar to the elements described with reference to FIG. 13 will not be provided.

Referring to FIGS. 14 and 15, the OLED device 800 may include a display panel 200, a touch screen 1400, a polarizing layer 430, a cover window 415, a lower protection film 300, etc. In example embodiments, the touch screen 1400 may include a touch screen electrode 380 and an organic insulation structure 390. Here, the touch screen electrode 380 may include a first touch screen electrode 382 and a second touch screen electrode 384, and the organic insulation structure 390 may include a first organic insulation layer 392, a second organic insulation layer 394, and a third organic insulation layer 396. For example, the touch screen electrode 380 of FIG. 14 may correspond to the touch screen electrode 380 (including a first touch screen electrode 382 and a second touch screen electrode 384) illustrated in FIG. 5. In some embodiments, the touch screen electrode 380 of FIG. 14 may correspond to the touch screen electrode 1380 (including a first touch screen electrode 1382, a second touch screen electrode 1384, and a connection pattern 1180) illustrated in FIG. 6.

The second organic insulation layer 394 may be disposed on the second touch screen electrode 384. The second organic insulation layer 394 may extend in the first direction D1, may cover the second touch screen electrode 384 in the light emitting region 30, and may have a first thickness T1 in the light emitting region 30. In example embodiments, the second organic insulation layer 394 may have a second thickness T2 in the bending region 50 on the display panel 200. In some embodiments, the second organic insulation layer 394 may have the first thickness T1 in the light emitting region 30 and the second thickness T2 in the bending region 50 on the display panel 200, and may be continuously disposed in the display region 10, the bending region 50, and a portion of the pad region 60 on the display panel 200. For example, a thickness of the second organic insulation layer 394 may be determined such that a neutral plane of the display panel 200 located in the bending region 50 is raised.

The OLED device 800 in accordance with example embodiments includes the organic insulation structure 390 including the first organic insulation layer 392, the second organic insulation layer 394, and the third organic insulation layer 396, and the organic insulation structure 390 may be disposed in the bending region 50 and may be utilized instead of a bending protection layer of a comparable OLED device. In embodiments where the second organic insulation layer 394 is formed to have the second thickness T2, which is a relatively large thickness, in the bending region 50, a neutral plane in the bending region 50 may be readily located at (or located above) a portion where the connection electrode 330 is disposed, because a thickness of the organic insulation structure 390 may be relatively increased.

FIG. 16 is a cross sectional view illustrating an OLED device in accordance with example embodiments. An OLED device 900 illustrated in FIG. 16 may have a configuration substantially the same as or similar to that of the OLED device 800 described with reference to FIGS. 14 and 15, except for including a touch screen 2400 and a FPCB 710. In FIG. 16, duplicative descriptions for the elements that are substantially the same as or similar to the elements described with reference to FIGS. 14 and 15 will not be provided.

Referring to FIG. 16, the OLED device 900 may include a display panel 200, a touch screen 2400, a polarizing layer 430, a cover window 415, a lower protection film 300, a FPCB 710, etc.

The FPCB 710 may be disposed on the pad electrode 470. The FPCB 710 may be electrically connected to the external device 101 (refer to FIG. 2).

The touch screen 2400 may have a first thickness T1 in the light emitting region 30 and a second thickness T2 in the bending region 50 on the display panel 200, and may be continuously formed in the display region 10, the bending region 50, and the pad region 60 on the display panel 200. In some embodiments, the touch screen 2400 may overlap a portion of the pad electrode 470 and a portion of the FPCB 710 in the pad region 60. As the touch screen 2400 covers a portion of the FPCB 710, the FPCB 710 might not be separated from the pad electrode 470.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

As used herein, expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

In addition, the terms "use," "using," and "used" may be considered synonymous with the terms "utilize," "utilizing," and "utilized," respectively.

The terms "substantially," "about," and similar terms are used as terms of approximation and not as terms of degree, and are intended to account for the inherent deviations in measured or calculated values that would be recognized by those of ordinary skill in the art.

Although the example embodiments of the present invention have been described herein, it is understood that the present invention should not be limited to these example embodiments but various changes and modifications can be made by one ordinary skilled in the art within the spirit and scope of the present invention as defined by the following claims and equivalents thereof.

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present. For example, when a first element is described as being "coupled" or "connected" to a second element, the first element may be directly coupled or connected to the second element or the first element may be indirectly coupled or connected to the second element via one or more intervening elements.

In this context, "consisting essentially of" means that any additional components will not materially affect the chemical, physical, optical or electrical properties of the corresponding layer.

The present invention may be applied to various display devices including an OLED device. For example, the present invention may be applied to a vehicle display device, a ship display device, an aircraft display device, various portable communication devices, display devices for display or for information transfer, a medical-display device, and/or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims and equivalents thereof. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and equivalents thereof.

What is claimed is:

1. An organic light emitting display ("OLED") device, comprising:
    a display panel comprising a display region that comprises a light emitting region and a peripheral region around the light emitting region, a pad region spaced from the display region, and a bending region between the display region and the pad region; and
    a touch screen on the display panel, the touch screen comprising:
        a plurality of touch screen electrodes in the display region; and
        an organic insulation structure covering the plurality of touch screen electrodes in the display region and extending in a first direction from the display region into the bending region and the pad region,
    wherein the display panel further comprises:
        a connection electrode in the bending region;
        a planarization layer on the connection electrode; and
        a pixel defining layer on the planarization layer, and
    wherein the planarization layer and the pixel defining layer are disposed between the organic insulation structure and the connection electrode in the bending region.

2. The OLED device of claim 1, wherein the organic insulation structure is continuous in the display region, the bending region, and a portion of the pad region on the display panel.

3. The OLED device of claim 1, wherein the plurality of touch screen electrodes comprises:
    a plurality of first touch screen electrodes extending in the first direction and a second direction opposite to the first direction, the plurality of first touch screen electrodes being spaced from each other in a third direction crossing the first and second directions; and
    a plurality of second touch screen electrodes on the plurality of first touch screen electrodes, the plurality of second touch screen electrodes extending in the third direction and being spaced from each other in the first and second directions,
    wherein the plurality of first touch screen electrodes crosses the plurality of second touch screen electrodes.

4. The OLED device of claim 3, wherein the organic insulation structure comprises:

a first organic insulation layer covering the plurality of first touch screen electrodes and extending in the first direction; and a second organic insulation layer on the first organic insulation layer, the second organic insulation layer covering the plurality of second touch screen electrodes and extending in the first direction.

5. The OLED device of claim 4, wherein the organic insulation structure further comprises:

a third organic insulation layer under the plurality of first touch screen electrodes and the first organic insulation layer.

6. The OLED device of claim 5, wherein the first, second, and third organic insulation layers each independently consist essentially of organic materials.

7. The OLED device of claim 5, wherein the second organic insulation layer has a first thickness in the light emitting region and a second thickness in the bending region, the second thickness being greater than the first thickness.

8. The OLED device of claim 7, wherein the second thickness of the second organic insulation layer is such that a neutral plane of the display panel in the bending region is raised.

9. The OLED device of claim 1, wherein the plurality of touch screen electrodes comprises:

a plurality of first touch screen electrodes extending in the first direction and a second direction opposite to the first direction, the plurality of first touch screen electrodes being spaced from each other in a third direction crossing the first and second directions;

a plurality of second touch screen electrodes at a same layer level with the plurality of first touch screen electrodes, the plurality of second touch screen electrodes being spaced from each other in the first and second directions, each of the plurality of second touch screen electrodes being between adjacent two of the plurality of first touch screen electrodes; and a plurality of connection patterns at a different layer level than the plurality of first and second touch screen electrodes, the plurality of connection patterns respectively electrically connecting adjacent two of the plurality of second touch screen electrodes in the third direction.

10. The OLED device of claim 9, wherein the organic insulation structure includes:

a first organic insulation layer covering the plurality of first and second touch screen electrodes and extending in the first direction; and a second organic insulation layer on the first organic insulation layer, the second organic insulation layer covering the plurality of connection patterns and extending in the first direction.

11. The OLED device of claim 10, wherein the organic insulation structure further comprises:

a third organic insulation layer under the plurality of first touch screen electrodes and the first organic insulation layer, wherein the first, second, and third organic insulation layers each independently consist essentially of organic materials.

12. The OLED device of claim 1, wherein the display panel further comprises:

a substrate;

a semiconductor element on the substrate;

a light emitting structure in the light emitting region on the substrate; and a thin film encapsulation structure on the light emitting structure.

13. The OLED device of claim 12, wherein the semiconductor element comprises:

an active layer on the substrate;

a gate insulation layer covering the active layer on the substrate and extending in the first direction;

a gate electrode on the active layer;

an insulating interlayer covering the gate electrode on the gate insulation layer and extending in the first direction; and source and drain electrodes on the gate electrode.

14. The OLED device of claim 13, wherein the gate insulation layer has a first opening exposing an upper surface of the substrate in the bending region, and the insulating interlayer has a second opening exposing the upper surface of the substrate in the bending region.

15. The OLED device of claim 12, wherein the light emitting structure comprises:

a lower electrode;

a light emitting layer on the lower electrode; and an upper electrode on the light emitting layer, and wherein the thin film encapsulation structure comprises:

a first thin film encapsulation layer comprising one or more inorganic materials having flexibility;

a second thin film encapsulation layer on the first thin film encapsulation layer, the second thin film encapsulation layer comprising one or more organic materials having flexibility; and a third thin film encapsulation layer on the second thin film encapsulation layer, the third thin film encapsulation layer comprising one or more inorganic materials having flexibility.

16. The OLED device of claim 15, wherein the touch screen is directly on the thin film encapsulation structure.

17. The OLED device of claim 12, wherein the connection electrode is disposed between the organic insulation structure of the touch screen and the substrate, the connection electrode electrically connects the light emitting structure and an external device.

18. The OLED device of claim 17, further comprising:

a lower protection film on a lower surface of the display panel, opposite from the touch screen;

a polarizing layer on the touch screen; and a window substrate on the polarizing layer.

19. The OLED device of claim 18, wherein the lower protection film comprises:

a first lower protection film pattern in the display region; and a second lower protection film pattern in the pad region, wherein the lower surface of the display panel is exposed in the bending region.

20. The OLED device of claim 19, wherein when viewed in a fourth direction crossing the first direction and being normal to an upper surface of the substrate, the bending region is bent around an axis extending along a third direction, crossing the first and fourth directions, and wherein when the bending region is bent, the second lower protection film pattern is on a lower surface of the first lower protection film pattern in the fourth direction.

* * * * *